US009107318B2

(12) United States Patent
Hida et al.

(10) Patent No.: US 9,107,318 B2
(45) Date of Patent: Aug. 11, 2015

(54) EASY-TO-ASSEMBLE STRUCTURE OF POWER CONVERTER

(75) Inventors: Kenshiro Hida, Chiryu (JP); Satoshi Iguchi, Kariya (JP); Kosuke Tokunaga, Okazaki (JP)

(73) Assignee: DENSO CORPORATION, Kariya (JP)

( * ) Notice: Subject to any disclaimer, the term of this patent is extended or adjusted under 35 U.S.C. 154(b) by 708 days.

(21) Appl. No.: 13/480,662

(22) Filed: May 25, 2012

(65) Prior Publication Data

US 2012/0300521 A1 Nov. 29, 2012

(30) Foreign Application Priority Data

May 26, 2011 (JP) ................................ 2011-117630
Mar. 9, 2012 (JP) ................................ 2012-052397

(51) Int. Cl.

*H02M 7/538* (2007.01)
*H05K 7/14* (2006.01)
*H05K 7/20* (2006.01)
*H02M 7/00* (2006.01)

(52) U.S. Cl.

CPC .......... *H05K 7/1432* (2013.01); *H05K 7/20927* (2013.01); *H02M 7/003* (2013.01)

(58) Field of Classification Search

CPC ... H02M 7/537; H02M 7/538; H02M 7/5387; H02M 7/5515
USPC ........................ 363/56.02, 58, 131, 132, 136
See application file for complete search history.

(56) References Cited

U.S. PATENT DOCUMENTS

| | | | | |
|---|---|---|---|---|
| 7,504,720 | B2 * | 3/2009 | Nakatsu et al. | 257/712 |
| 7,561,429 | B2 * | 7/2009 | Yahata et al. | 361/715 |
| 7,777,433 | B2 * | 8/2010 | Yamaguchi et al. | 318/139 |
| 2008/0049476 | A1 * | 2/2008 | Azuma et al. | 363/131 |
| 2008/0112201 | A1 * | 5/2008 | Yahata et al. | 363/131 |

FOREIGN PATENT DOCUMENTS

JP 2010-119274 5/2010

* cited by examiner

*Primary Examiner* — Adolf Berhane
*Assistant Examiner* — Yemane Mehari
(74) *Attorney, Agent, or Firm* — Nixon & Vanderhye P.C.

(57) ABSTRACT

An easy-to-assemble structure of a power converter includes a control circuit board, semiconductor modules with power terminals and control terminals extending therefrom, and a capacitor to smooth voltage to be applied to the semiconductor modules. The capacitor includes capacitor devices coupled to the power terminals and voltage measuring terminals joined to electrodes of the capacitor devices. The control terminals and the voltage measuring terminals extend in a direction normal to the surface of the control circuit board. This permits the connections of the voltage measuring terminals and the control terminals with the control circuit board to be achieved simultaneously by bringing them close to the control circuit board from the normal direction.

16 Claims, 38 Drawing Sheets

1
36
361
14
16
7a
20(20a)
7b
20(20b)
130
20(20c)
12(12a)
15
10
13
12
(11)
2
(22)
3
30
20
12
(12b)
A
(32a) 32
(32b) 32
(32c) 32
131
17
X
Y 3
30
31
32
33
38
(38a)
(38b)
39
(39a)
(39b)
390
395
310
42
48
4
2
(22)
10
12(11)
13
20
(20a)
(20b)
(20c)
200
21
7a
7b
73
74
Z
Y 16
16
360
14
15
20(20a)
130
20(20b)
20(20c)
12(12a)
10
13
12
(11)
18
18
20
2
S
12
(12b)
360
131
17
X
Y 1
60
MG
7a
7b
62
20a
20b
20c
C
E
G
23a
23b
$V_H$
N
3
(30b)
24
23
63
61
$V_L$
3
(30a)
19

315
33
32
31
32
34
34
3

3
31
315
33
32
35
35
340
34
340

16
16
36
14
15
7a
7b
10
13
3
12
(11)
2
B
B
I
I
18
36
17
X
Y 1
13
12(11)
Z
Y
4
20 (20c)
20 (20b)
20 (20a)
7a
7b
21
2
310
3
30
31

3
30
31
310
(321)
32
(322)
32
7a
(20a)
20
(20b)
20
(20c)
20
2
21
4
1
13
12(11)
Z
Y

Z
Y
13
10
4
2
(22)
20
(20c)
20
(20b)
20
(20a)
21
32
(321)
300
32
(322)
42
3
30
33
31
38
(38b)

13
339
31
Y
X
336
330
335
391
393
392
W
32
(321)
345
32
(322)
300
336
339
399
3

4
47
42
45
400
46, 47
43
46
41
44

4
47
42
45
400
47
43
46
46
41
44

EASY-TO-ASSEMBLE STRUCTURE OF POWER CONVERTER

CROSS REFERENCE TO RELATED DOCUMENT

The present application claims the benefit of priority of Japanese Patent Application Nos. 2011-117630 and 2012-52397 filed on May 26, 2011 and Mar. 9, 2012, disclosures of which are incorporated herein by reference.

BACKGROUND

1. Technical Field

This application relates generally to a power converter equipped with a semiconductor module and a capacitor working to smooth the voltage applied to the semiconductor module.

2. Background Art

FIG. 43 illustrates a conventional power converter 9, as taught in Japanese Patent First Publication No. 2010-119274, which works to perform power conversion between DC power and AC power. The power converter consists of a plurality of semiconductor modules 92 in which semiconductor devices are installed and a cooling pipe which dissipates thermal energy from the semiconductor modules 92.

Each of the semiconductor modules 92 includes a plurality of power terminals 98 and control terminals 921. The power terminals 98 are broken down into a positive terminal 98*a* to be connected to a positive electrode of a dc power supply (not shown), a negative terminal 98*b* to be connected to a negative electrode of the dc power supply, and ac terminals 98*c* to be coupled to an ac load (not shown). The control terminals 921 are coupled to a control circuit board 94. The control circuit board 94 works as a controller to control operations of the semiconductor modules 92 to translate a dc voltage applied to the positive terminal 98*a* and the negative terminal 98*b* into an ac voltage which is to be outputted from the ac terminals 98*c*.

The power terminals 98*a* to 98*c* are coupled to bus bars 99 (i.e., a positive bus bar 99*a*, a negative bus bar 99*b*, and an ac bus bar 99*c*). Specifically, the power terminals 98*a* and 98*b* are joined to the dc power supply through the positive terminal 98*a* and the negative terminal 98*b*. The ac terminal 98*c* is joined to the ac load. A smoothing capacitor 97 is connected to the positive bus bar 99*a* and the negative bus bar 99*b*.

The control circuit board 94 has fabricated thereon a voltage detector which monitors the voltage developed at the smoothing capacitor 97. The monitored voltage is used for controlling the operation of the ac load. The smoothing capacitor 97 is coupled to the voltage detector through wires 95 and an electric connector 96.

The power converter 9, however, faces the problem that the assembling of the power converter 9 requires two discrete steps: one is to join the semiconductor modules 92 to the control circuit board 94, and the other is to connect the smoothing capacitor 97 to the control circuit board 94.

Specifically, the production of the power converter 9 needs two connecting steps of putting the control terminals 921 into connector holes 93 formed in the control circuit board 94 and then drawing the wires 95 from the smoothing capacitor 97 to joint them to the connector 96.

SUMMARY

It is therefore an object of this disclosure to provide an improved structure of a power converter which is designed to connect semiconductor modules and a capacitor to a control circuit board in a decreased number of steps.

According to one aspect of an embodiment, there is provided a power converter which may be employed in automotive vehicles such as electric cars or hybrid cars. The power converter comprises: (a) a control circuit board; (b) a plurality of semiconductor modules each of which includes a main unit in which semiconductor devices are fabricated, the main unit having power terminals and control terminals extending therefrom; (c) a capacitor working to smooth voltage to be applied to the semiconductor modules, the capacitor including capacitor devices coupled to the power terminals and voltage measuring terminals coupled to electrodes of the capacitor devices; (d) a control circuit disposed on the control circuit board to control switching operations of the semiconductor devices of the semiconductor modules; and (e) a voltage detector disposed on the control circuit board to measure voltages applied to the capacitor devices. The control terminals extend in a direction normal to a surface of the control circuit board in connection with the control circuit. The voltage measuring terminals extend in a direction normal to the surface of the control circuit board in connection with the voltage detector. Therefore, in assembling of the power converter, the connections of the voltage measuring terminals and the control terminals with the control circuit board may be achieved simultaneously by bringing the voltage measuring terminals and the control terminals close to the control circuit board from the normal direction. This eliminates the need for two discrete steps of connecting the voltage measuring terminals to the control circuit board and connecting the control terminals to the control circuit board, thus resulting in a decrease in number of steps of assembling the power converter.

Additionally, the connection of the capacitor to the voltage detector is achieved without need for an additional step of, for example, drawing wires from the capacitor, as illustrated in FIG. 43. The wires are usually flexible. It is, thus, difficult to draw the wires from the capacitor and connect them to a connector automatically. In contrast, the voltage measuring terminals are not flexible, thus facilitating the ease with which the capacitor is joined to the voltage detector.

All of the voltage measuring terminals may be laid to overlap the control circuit board, as viewed from the direction normal to the surface of the control circuit board. In other words, the voltage measuring terminals are all disposed inside the control circuit board, as viewed from the normal direction, thus permitting the power converter to be reduced in size.

The capacitor and the semiconductor modules may be arrayed adjacent each other in a direction parallel to the major surface of the control circuit board. This permits the capacitor and the semiconductor modules to be located as close to each other as possible, thus allowing bus bars connecting the capacitor and the semiconductor modules to be decreased in length.

Each of the voltage measuring terminals may be made up of a first section joined to one of the capacitor devices and a second section made to be separate from the first section. The second section is secured to the first section and couple with the voltage detector. This results in a decrease in production cost of the power converter. Usually, it is necessary to make the voltage measuring terminal to integrally include a portion which is to be in electric contact with the electrode of the capacitor device. The voltage measuring terminal is made of, for example, a metal strip. If the voltage measuring terminal is made of a one-piece strip, it will be longer than each of the first and second sections. For instance, when the measuring terminal is cut out, as illustrated in FIG. 42, from the metal plate 70 into an L-shape, it produces the large useless portion 72. The structure of the voltage measuring terminal is designed to eliminate such a problem. The voltage measuring terminal is, as described above, made up of two discrete parts: the first and second sections, thus permitting the first section to be decreased in length to increase the area of the useless portion 72. This results in a decrease in production cost of the voltage measuring terminals.

The second section may be made of a one-piece member of a combination of a plurality of discrete members.

The second section may have a portion extending parallel to the major surface of the control circuit board. A joint of the second section to the first section may be located away from a joint of the second section to the voltage detector, as viewed from the direction normal to the major surface of the control circuit board. In other words, a portion of the first section of the voltage measuring terminal extending outside the capacitor may be located away from the voltage detector, thereby resulting in an increase in freedom of arrangement of the voltage detector on the surface of the control circuit board.

The power converter may also include a terminal module in which the second sections of all of the voltage measuring terminals are disposed inside a sealed capsule. This facilitates the ease with which the first and second sections are aligned with each other and joined together.

Either of the first and second sections may have a protrusion at which the first and second sections are welded. The second section may have a width which is greater than a tolerance for misalignment of the first section in a width-wise direction of the second section. The welding of the first and second sections may, thus, be achieved by pressing the tip of the protrusion against the surface of the second section, in other words, established at a small contact area between the first and second sections, thus resulting in a decreased amount of thermal energy, as generated by the resistance welding, which facilitates the ease of welding operation.

The width of the second section is, as described above, is selected to be greater than the tolerance for misalignment of the first section in the width-wise direction of the second section during the assembling of the capacitor, thereby ensuring the stability in contact, that is, welding between the first and second sections at the protrusion even when the first section is misaligned in the width-wise direction of the second section.

The capacitor may have a casing in which the capacitor devices are disposed and has an opening through which the capacitor devices are to be installed. The capacitor is retained or fixed with the opening facing the semiconductor modules. This permits bus bars connecting the capacitor and the semiconductor modules to be decreased in length. This results in a decrease in inductance L of the bus bars, which leads to a reduction in surge voltage V (=Ldi/dt) which occurs when the semiconductor modules are turned on or off.

The casing may have positioning grooves in which the voltage measuring terminals are fit. This facilitates the ease with which the voltage measuring terminals are positioned relative to the control circuit board and joined thereto in assembling of the power converter.

Each of the positioning grooves may have formed on an inner wall thereof a pair of protrusions which create a nip through which a corresponding one of the voltage measuring terminals extends. This improves the resistance of the voltage measuring terminal to mechanical vibration and the accuracy in positioning the voltage measuring terminal. This facilitates the ease with which the voltage measuring terminals are positioned relative to the control circuit board and joined thereto in assembling of the power converter.

The control circuit board may be designed to have a high-voltage region to which voltage to be developed at the power terminals is applied and a low-voltage region to which the voltage lower than the voltage to be developed at the power terminals is applied. The voltage detector is disposed on a peripheral area of the low-voltage region. This permits an available area of the control circuit board where electronic parts are to be mounted to be increased. Since the higher voltage is applied to the high-voltage region, an insulating region needs to be provided between the high-voltage region and the low-voltage region. Similarly, since the higher voltage is applied to the voltage detector, an insulation region (i.e., a detector insulating region needs to be disposed around the voltage detector. It is impossible to mount the electronic parts over the insulating region and the detector insulating region. If the voltage detector is disposed in the center of the low-voltage region, a need will arise for increasing the size of the detector insulating region, so that an area of the low-voltage region occupied by the detector insulating region is increased, thus resulting in a decrease in available area of the control circuit board. The voltage detector in this disclosure is, however, disposed on the peripheral area of the low-voltage region, thus decreasing the area of the low-voltage region occupied by the detector insulating region. The detector insulating region may be laid to overlap the insulating region partially, so that such an overlap serves as both a portion of the insulating region and a portion of the detector insulating region, thus resulting in a decreased area of the low-voltage region occupied by the detector insulating region, that is, an increased available area of the control circuit board.

The control circuit board may have an insulating region which delimits and electrically insulates between the high-voltage region and the low-voltage region. The voltage detector is disposed in abutment with a side edge of the control circuit board and the insulating region. This enables the insulating region and the detector insulating region to overlap each other partially, so that the overlap may be functionally shared by the insulating region and the detector insulating region. This results in a decreased area of the control circuit board occupied only by the detector insulating region. The area of the voltage detector may extend until the side edge of the control circuit board. This eliminates the need for the detector insulating region to surround the entire periphery of the voltage detector, thereby further decreasing the area of the control circuit board occupied only by the detector insulating region, thus resulting in an increase in available area of the control circuit board.

A portion of the control terminals of each of the semiconductor modules works as a low-potential terminal coupled electrically to low-potential electrodes of the capacitor devices. The voltage measuring terminals is coupled electrically to high-potential electrodes of the capacitor devices. The voltage detector is disposed adjacent to the low-potential terminals and uses the low-potential terminals and the voltage measuring terminals to measure the voltage developed at the capacitor. In other words, the power converter is designed to use a portion of the control terminals of the semiconductor modules to measure the voltages appearing at the capacitor devices, thus permitting the number of the voltage measuring terminals to be decreased.

The casing may be designed to have an outer wall on which terminal holders are formed. Each of the terminal holders is made up of a pair of protrusions which hold a portion of one of the voltage measuring terminals in contact therewith. A contact of one of the pair of protrusions with the one of the voltage measuring terminals is located closer to the opening of the casing than the other of the pair of protrusions. This ensures the enhanced stability in retaining the voltage measuring terminal on the casing, which improves the accuracy in positioning the voltage measuring terminal to facilitate the ease with which the voltage measuring terminal is joined to the control circuit board. The casing may be made of resin and have the advantage that it is insusceptible to breakage. If the contacts of the protrusions with the voltage measuring terminal are arrayed in alignment with each other in a direction in which the voltage measuring terminal is held, it will result in a decreased linear interval therebetween. This requires the need for using resin-molding dies in which projections for forming the contacts are located close to each other to make the casing. The decreasing of the linear interval requires the projections of the resin-molding die to have a decreased width, which will be subjected to breakage during use. In contrast, the contacts of the protrusions of the terminal holder with the voltage measuring terminal are offset from each other to increase the liner interval therebetween, thus enabling the distance between the projections of the resin-molding dies to be increased to avoid the breakage thereof in the course of forming the casing.

A given number of the terminal holders are provided to hold each of the voltage measuring terminals. In other words, the terminal holders are broken down into a plurality of groups each for one of the voltage measuring terminals. The terminal holders of each group are broken down into two types: a projection terminal holder and a flat face terminal holder. The protrusions of the projection terminal holder have projections which form a grip through which one of the voltage measuring terminals passes. The protrusions of the flat face terminal holder have flat faces which are placed in surface contact with the one of the voltage measuring terminals. The flat face terminal holder is located closer to the control circuit board than the projection terminal holder.

In short, the projection terminal holder serves to retain the voltage measuring terminal firmly, thus enhancing the resistance of the voltage measuring terminal to the mechanical vibration.

The contacts of the protrusions of each of the terminal holders with the voltage measuring terminal are shifted from each other, in other words, arranged out of alignment with each other in the direction perpendicular to the length of a corresponding one of the voltage measuring terminals. The holding of the voltage measuring terminal by the contacts may, therefore, result in bending thereof, which increases the difficulty in joining the voltage measuring terminals to the control circuit board. In order to alleviate this problem, each of the groups of the terminal holders has at least the one flat face terminal holder to hold the voltage measuring terminal by the flat faces placed in direct contact therewith, thereby enhancing the accuracy in orienting or positioning the voltage measuring terminal on the casing to facilitate the ease with which the voltage measuring terminal is joined to the control circuit board.

Each of the voltage measuring terminals may be designed to have reinforcement ribs which are placed in contact with a corresponding one of the terminal holders and extend substantially parallel to an outer wall of the casing.

Each of the reinforcement ribs works to increase the mechanical strength of the voltage measuring terminal, which increases the resistance of the voltage measuring terminal to bending thereof when inserted and held between the protrusions of the terminal holder. This results in improvement of stability of orientation of the voltage measuring terminal, thereby facilitating the ease with which the voltage measuring terminal is joined to the control circuit board.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
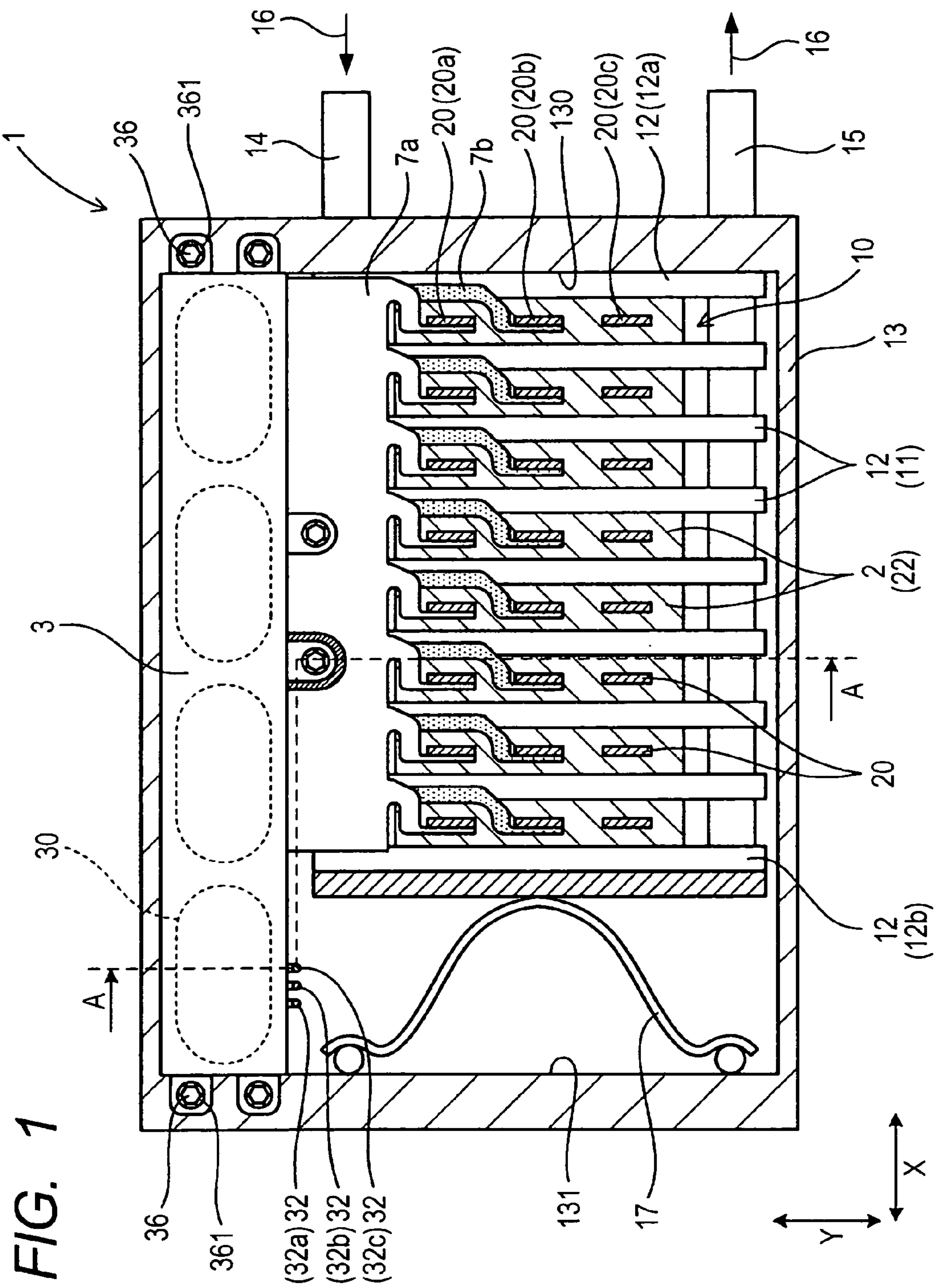
FIG. 1 is a plan view which illustrates a power converter according to the first embodiment.
Figure 2:
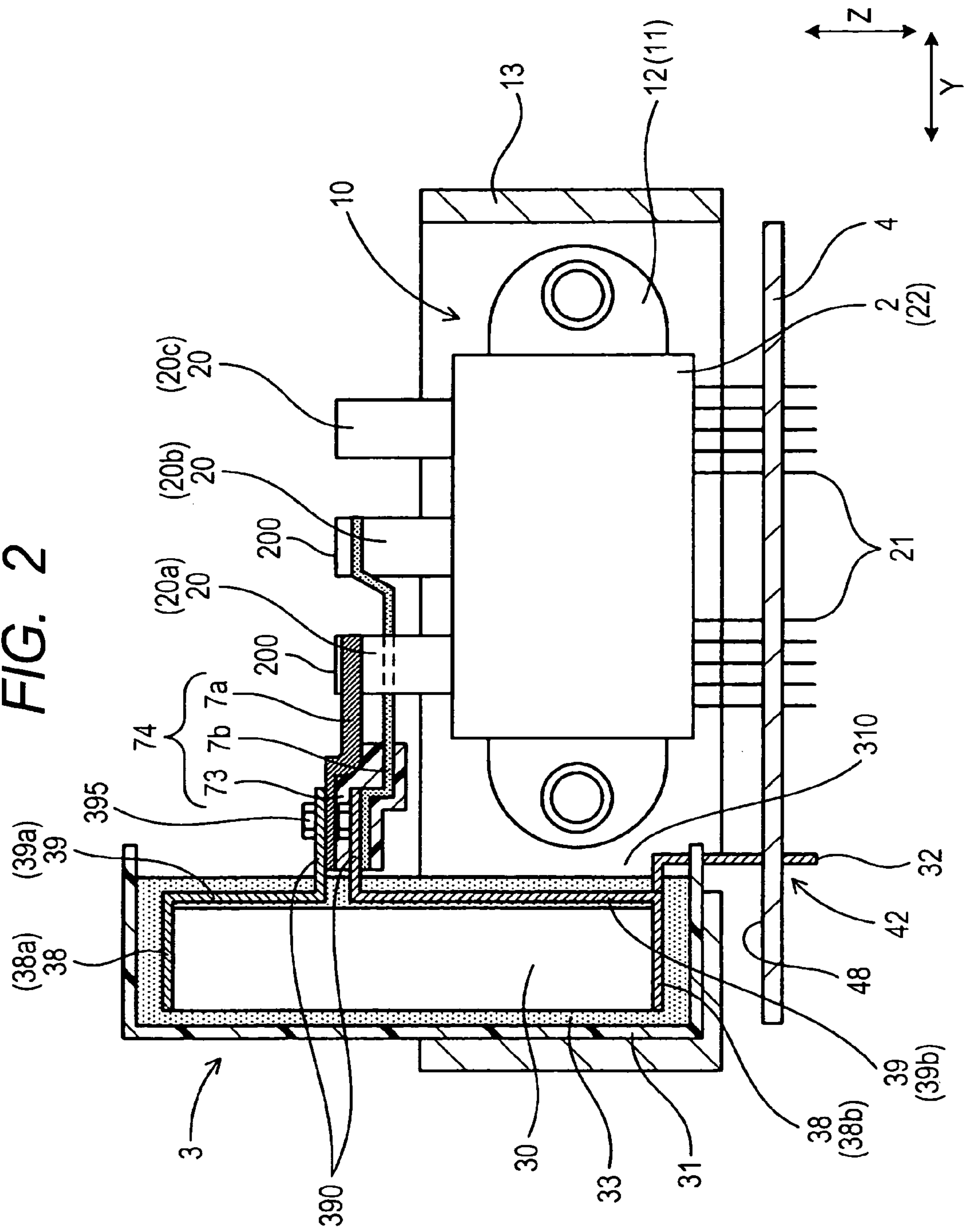
FIG. 2 is a sectional view taken along the line A-A in FIG. 1.
Figure 5:
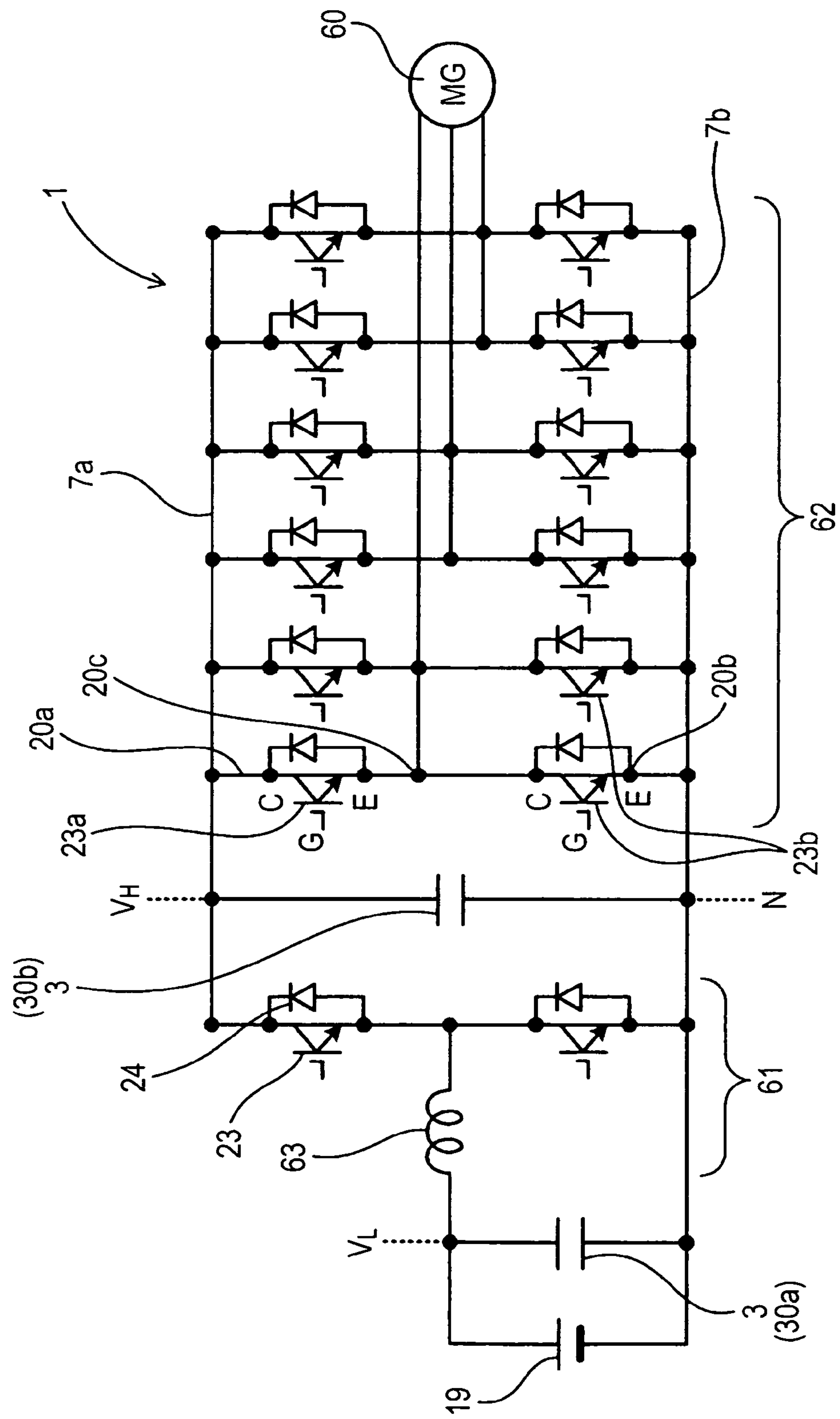
FIG. 5 is a circuit diagram which illustrates an electric structure of the power converter of FIG. 1.
Figure 6:
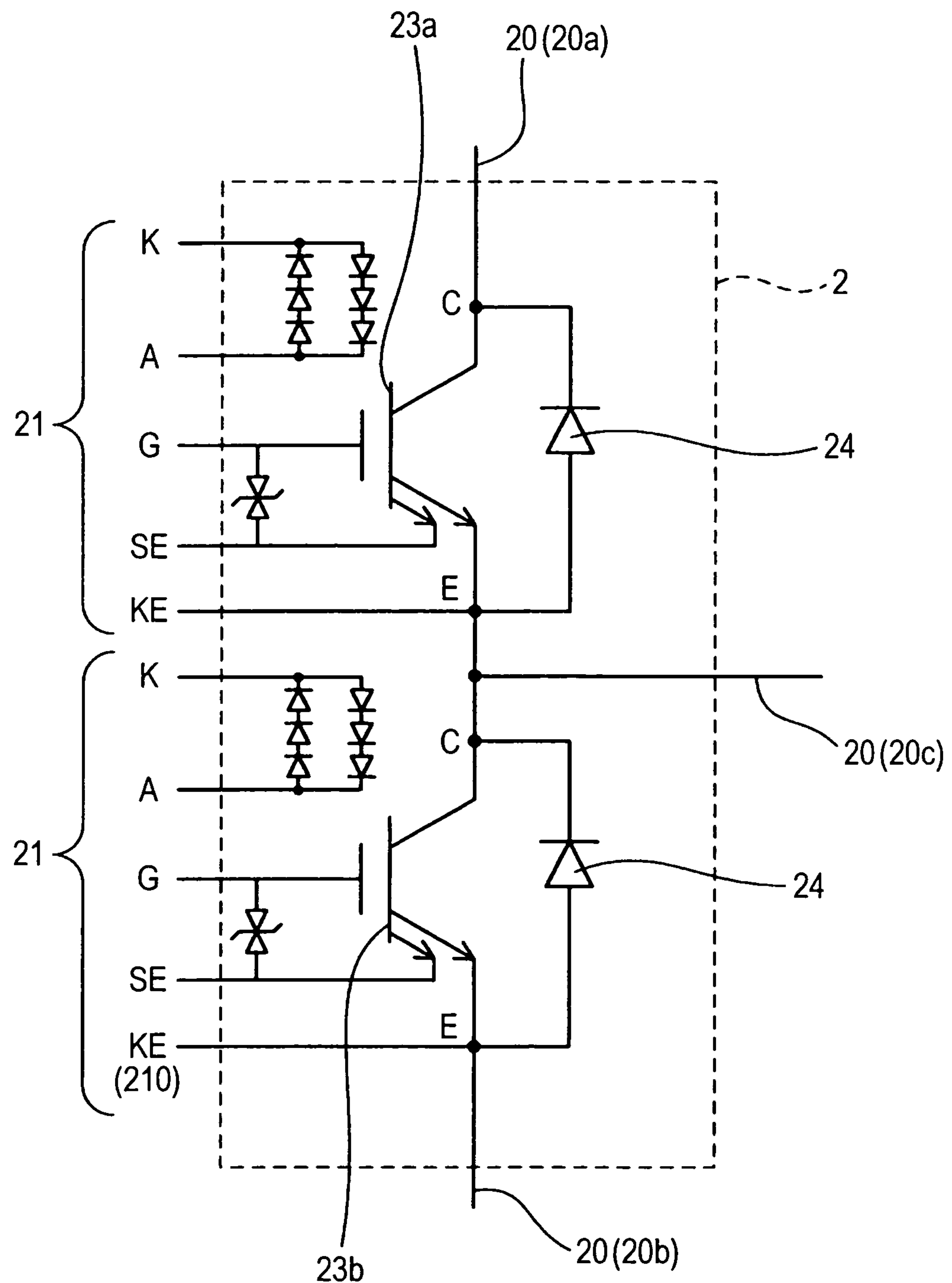
FIG. 6 is a circuit diagram which illustrates an electric structure of a semiconductor module installed in the power converter of FIG. 1.

Referring to the drawings, wherein like reference numbers refer to like parts in several views, particularly to FIGS. 1 and 2, there is shown a power converter 1 which may be mounted in automotive vehicles such as electric vehicles or hybrid vehicles. The power converter 1 is equipped with a plurality of semiconductor modules 2, a capacitor 3, and a control circuit board 4. Each of the semiconductor modules 2 includes a main unit 22 in which semiconductor devices 23, as illustrated in FIGS. 5 and 6, are fabricated. The main unit 22 has power terminals 20 and control terminals 21 extending therefrom.

The capacitor 3 is, as illustrated in FIG. 2, equipped with a plurality of capacitor devices 30 (four capacitor devices 30 in this embodiment) connecting with the power terminal 20, a housing or casing 31 in which the capacitor devices 30 are disposed, and voltage measuring terminals 32 connecting with electrodes 38 of the capacitor devices 30.

Figure 4:
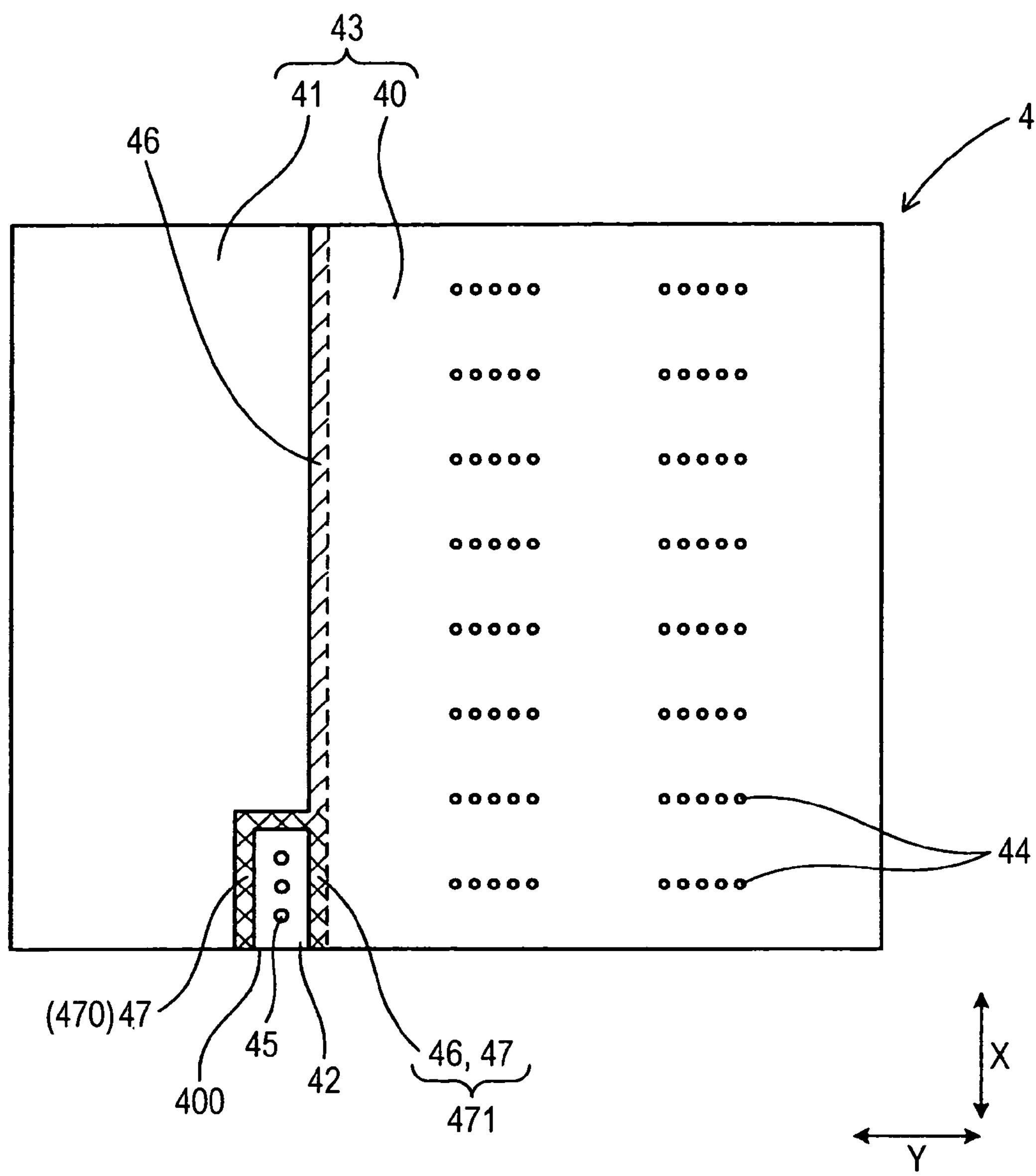
FIG. 4 is a plan view which illustrates a control circuit board installed in the power converter of FIG. 1.

The control circuit board 4 has disposed thereon a control circuit 43, as illustrated in FIG. 4, which works to control switching operations of the semiconductor modules 2 and a voltage detector 42 which works to measure the voltage applied to the capacitor devices 30.

The control terminals 21 extend in a direction (i.e., the Z-direction in FIG. 2) normal to the major surface of the control circuit board 4 and connect with the control circuit 43.

The voltage measuring terminals 32 extend in a direction (i.e., the Z-direction) normal to the major surface of the control circuit board 4 and connect with the voltage detector 42.

The control terminals 21 and the voltage measuring terminals 32, as can be seen from FIG. 2, have end portions extending in the Z-direction. The control circuit board 4, as illustrated in FIG. 4, has formed therein a plurality of through holes 44 and 45 opening in the Z-direction. To the holes 44 and 45, the ends of the control terminals 21 and the voltage measuring terminals 32 are inserted from the Z-direction. The control terminals 21 are connected electrically to the control circuit board 4. The voltage measuring terminals 32 are connected electrically to the control circuit board 4.

Each of the semiconductor modules 2 is, as can be seen from FIG. 2, equipped with a plurality of power terminals 20. The power terminals 20 include positive terminals **20*a* which, as illustrated in FIG. 5, connect with a positive electrode of a dc (direct current) power supply 19, negative terminals 20*b* which connect with a negative electrode of the dc power supply 19, and ac (alternating current) terminals 20*c* which connect with an ac load 60. The control circuit board 4 is, as described above, joined to the control terminals 21 of the semiconductor modules 2 and works to control the switching operations of the semiconductor modules 2 to convert the dc voltage, as developed between the positive terminals 20*a* and the negative terminals 20*b* into the ac voltage which is, in turn, outputted from the ac terminals 20*c***.

The semiconductor modules 2 and the capacitor 3 are, as illustrated in FIG. 2, located adjacent each other in a direction parallel to the major surface 48 of the control circuit board 4.

The semiconductor modules 2 and a plurality of cooling pipes 12 are laid to overlap each other to form a semiconductor stack 10. The cooling pipes 12 have formed therein coolant paths 11 through which a cooling medium or coolant 16 flows.

Figure 3:
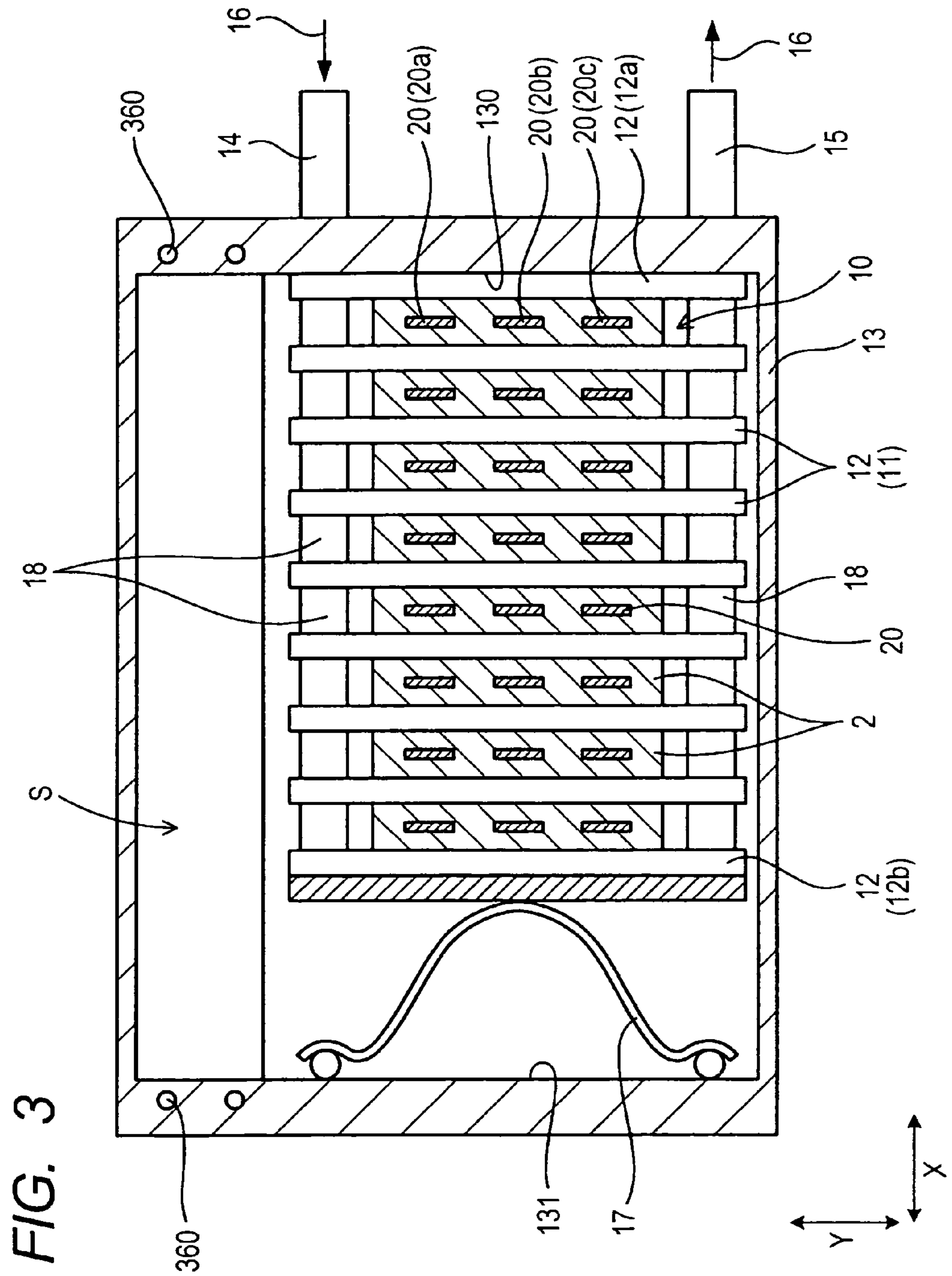
FIG. 3 is a plan view which illustrates the power converter of FIG. 1 from which bus bars and a capacitor are omitted.

The cooling pipes 12, as clearly illustrated in FIG. 3, extend in a longitudinal direction of the semiconductor module 1, that is a direction in which the semiconductor modules 2 are stacked (i.e., the X-direction). Every adjacent two of the cooling pipes 12 are joined together at ends thereof opposed to each other in the Y-direction through a pair of connecting pipes 18. The outermost one of the cooling pipes 12 in the X-direction, that is, the cooling pipe **12*a* is joined to an inlet pipe 14 through which the coolant 16 is loaded into the cooling paths 11 and an outlet pipe 15 through which the coolant 16 is discharged from the cooling paths 11. After entering the cooling paths 11 from the inlet pipe 14, the coolant 16 is distributed to the cooling paths 11, respectively, and flows out of the outlet pipe 15, thereby absorbing the thermal energy, as produced by the semiconductor modules 2, to cool the whole of the semiconductor stack 10**.

The power converter 1 is equipped with a metallic frame 13 which is of a substantially rectangular shape. A spring 17 is, as illustrated in FIGS. 1 and 3, disposed between one of the cooling pipes 12 which is located at the end of the semiconductor stack 10, that is the leftmost cooling pipe **12*b* and an inner end wall 131 of the frame 13. The spring 17 urges the semiconductor stack 10 elastically against the inner end wall 131 of the frame 13 to bring the cooling pipes 12 into constant abutment with the semiconductor modules 2 and also to retain the semiconductor stack 10 within the frame 13**.

The spring 17 may alternatively be disposed between the leftmost cooling pipe 12*a* and an inner end surface of the frame 13 to urge the semiconductor stack 10 into constant abutment with the inner end wall 131 of the frame 13.

The frame 13, as illustrated in FIG. 3, has formed therein a chamber S in which the capacitor 13 is retained. The frame 13 also has formed therein a plurality of mount holes 361 with internal threads 360. In assembling of the power converter 1, the capacitor 3 is, as illustrated in FIG. 1, installed in the mount chamber S, after which bolts 36 secured to the capacitor 3 are fastened into the mount holes 361 to fix the capacitor 3 to the frame 13.

To the positive terminals 20*a* of the semiconductor modules 2, a positive bus bar 7*a* is welded. Similarly, to the negative terminals 20*b* of the semiconductor modules 2, a negative bus bar 7*b* is welded. The negative bus bar 7*b* is partially covered with a resinous insulator 73. The positive bus bar 7*a* is placed on the surface of the insulator 73. The positive bus bar 7*a*, the negative bus bar 7*b*, and the insulator 73 are united to form a bus module 74.

The capacitor 3 is made up of the capacitor devices 30, the casing 31 in which the capacitor devices 30 are disposed, and a resinous capsule 33 by which the capacitor devices 30 are sealed within the casing 31. The plurality of capacitor devices 30 are, as described above in FIG. 1, retained within the casing 31. The casing 31 has formed therein an opening 310 through which the capacitor devices 30 are to be installed in the casing 31. The capacitor 3 is secured to the frame 13 with the opening 310 of the casing 31 facing the semiconductor modules 2.

Each of the capacitor devices 30 has ends 38 which are opposed to each other in the X-direction in which the power terminals 20 extend. The ends 38 serve as electrodes 38*a* and 38*b* connecting electrically with the power terminals 20.

The electrodes 38*a* and 38*b* of each of the capacitor devices 30 have metallic connecting plates 39 which will also be indicated by 39*a* and 39*b* below. Each of the connecting plates 39 is bent within the casing 31 to have ends 390 extending outside the capsule 33. The ends 390 extend parallel to the Y-direction at heights substantially equal to that of the ends 200 of the power terminals 20. In other words, the ends 390 are oriented substantially in alignment with the ends 200 of the power terminals 20 in the Y-direction and secured to the positive bus bar 7*a* through bolts 395.

The capacitor 3 is also equipped with the voltage measuring terminals 32, as described above. The voltage measuring terminals 32 extend from the connecting plates 39*b* outside the capsule 33 toward the semiconductor modules 2 in the Y-direction, bent at right angles toward the control circuit board 4 in the Z-direction, and then connect with the voltage detector 42 on the control circuit board 4. The voltage measuring terminals 32 are each made of a metallic plate and have a given degree of rigidity. Each of the connecting plates 39 and a corresponding one of the voltage measuring terminals 32 are made of a one-piece member.

The whole of the voltage measuring terminals 32 is, as can be seen from FIGS. 1 and 2, laid to overlap with the control circuit board 4, as viewed from the Z-direction. In other words, as viewed from the Z-direction, the voltage measuring terminals 32 are all disposed inside the control circuit board 4.

The capacitor 3 is, as described in FIG. 1, made up of the capacitor devices 30. Two of the capacitor devices 30 work as a filter capacitor device 30*a*, as illustrated in FIG. 5, to smooth the voltage at the dc power supply 19 before being stepped up. The other capacitor devices 30 work as a main capacitor device 30*b* to smooth the voltage after being stepped up. These two types of capacitor devices 30*a* and 30*b* are connected electrically at the lower potential electrodes 38 thereof to the common connecting plate 39, while they are connected electrically at the higher potential electrodes 38 to the connecting plates 39, respectively.

Referring back to FIG. 1, the power converter 1 is equipped with the three voltage measuring terminals 32. One of the voltage measuring terminals 32 serves as a first voltage measuring terminal 32*a* which is connected to the lower potential electrodes 38 of the capacitor devices 30*a* and 30*b*. One of the voltage measuring terminals 32 serves as a second voltage measuring terminal 32*b* which is connected to the higher potential electrode 38 of the filter capacitor device 30*a*. The other voltage measuring terminal 32 serves as a third voltage measuring terminal 32*c* which is connected to the higher potential electrode 38 of the main capacitor device 30*b*. The voltage measuring terminals 32*a*, 32*b*, and 32*c* are used to measure the voltage $V_L$ at the dc power supply 19 before being stepped up and the voltage $V_H$ at the dc power supply 19 after being stepped up. The voltages $V_L$ and $V_H$ are used to control the operation of the ac load 60.

The circuit structure of the power converter 1 will be described with reference to FIG. 5. The power converter 1 is equipped with a step-up circuit (e.g., a step-up transformer) 61 which works to step-up the dc voltage developed at the dc power supply 19 and an inverter 62 which works to translate the step-upped voltage into an ac voltage. The step-up circuit 61 is made up of two semiconductor devices 23 (e.g., IGBTs) and a choke coil 63. Each of the semiconductor devices 23 has a freewheel diode 24 connected parallel thereto in a backward direction.

The step-up circuit 61 consists of the semiconductor devices 23 which are broken down into upper-arm semiconductor devices 23*a* which are connected at collectors thereof (i.e., the positive terminals 20*a*) to the positive bus bar 7*a* and lower-arm semiconductor devices 23*b* which are connected at emitters thereof to the negative bud bar 7*b*. Each of the semiconductor modules 2 has one of the upper-arm semiconductor devices 23*a* and one of the lower-arm semiconductor devices 23*b* which are sealed therein. The emitter of the upper-arm semiconductor device 23*a* and the collector of the lower-arm semiconductor device 23*b* are connected electrically to the ac terminal 20*c* within the semiconductor module 2.

Each of the semiconductor modules 2 is, as illustrated in FIG. 6, equipped with the ten control terminals 21. The control terminals 21 include temperature-sensing cathodes K for use in measuring the temperature of the semiconductor module 2, temperature-sensing anodes A for use in measuring the temperature of the semiconductor module 2, gates G of the semiconductor devices 23 (IGBTs) in FIG. 6, current-sensing emitters SE for use in taking out a portion of emitter current, and kelvin emitters KE at which a reference potential is developed for the gates G. A set of the temperature-sensing cathode K, the temperature-sensing anode A, the gate G, the current-sensing emitter SE, the kelvin emitter KE is provided for each of the upper-arm and lower-arm semiconductor devices 23*a* and 23*b*.

The control circuit board 4 has, as clearly illustrated in FIG. 4, disposed thereon the control circuit 43 working to control the switching operations of the semiconductor modules 2 and the voltage detector 42 working to measure the voltage appearing across the semiconductor devices 30. The control circuit 43 (i.e., the control circuit board 4) includes a high-voltage region 40 to which the voltages $V_L$ and $V_H$ developed at the semiconductor modules 2 (i.e., the power terminals 20) are applied and a low-voltage region 41 to which the voltage lower than the voltage $V_H$ is applied. The voltage detector 42 is disposed on a peripheral area of the low-voltage region 41.

The high-voltage region 40 and the low-voltage region 41 are delimited by an insulating region 46 to electrically insulate therebetween. The voltage detector 42 is disposed in direct contact with the insulating region 46 and also embraced by an insulating region which will also be referred to as a detector insulating region 47 below. The detector insulating region 47 is, as clearly illustrated in FIG. 4, laid to overlap the insulating region 46 partially. An overlap 471 between the detector insulating region 47 and the insulating region 46 serves to insulate the voltage detector 42 from the high-voltage region 40. A remaining L-shaped portion 470 of the detector insulation region 47 which does not overlap the insulating region 46 is made up of two sides: one extending from the insulating region 46 in the Y-direction, and the other extending from the former side in the X-direction until a side edge 400 of the control circuit board 4. The L-shaped portion 470 serves to insulate the voltage detector 43 from the low-voltage region 41.

In the high-voltage region 40, through holes 44 are formed for insertion of the control terminals 21. Electronic parts (not shown) are fabricated in the high-voltage region 40 to make a gate driver which drives the semiconductor modules 2.

Similarly, in the low-voltage region 41, electronic parts (not shown) such as a microcomputer or resistors are installed to make an electric circuit working to a signal to the gate driver in the high-voltage region 40. To the low-voltage region 41, a voltage of, for example, several volts required to activate the electronic parts is applied.

The voltage detector 42 has formed therein through holes 45 through which the voltage measuring terminals 32*a* to 32*c* are inserted. The voltage detector 42 may be made of a voltage divider to measure the before-stepped up voltage $V_L$ and the after-stepped up voltage $V_H$, as produced by the dc power supply 19 (see FIG. 5).

Figure 7:
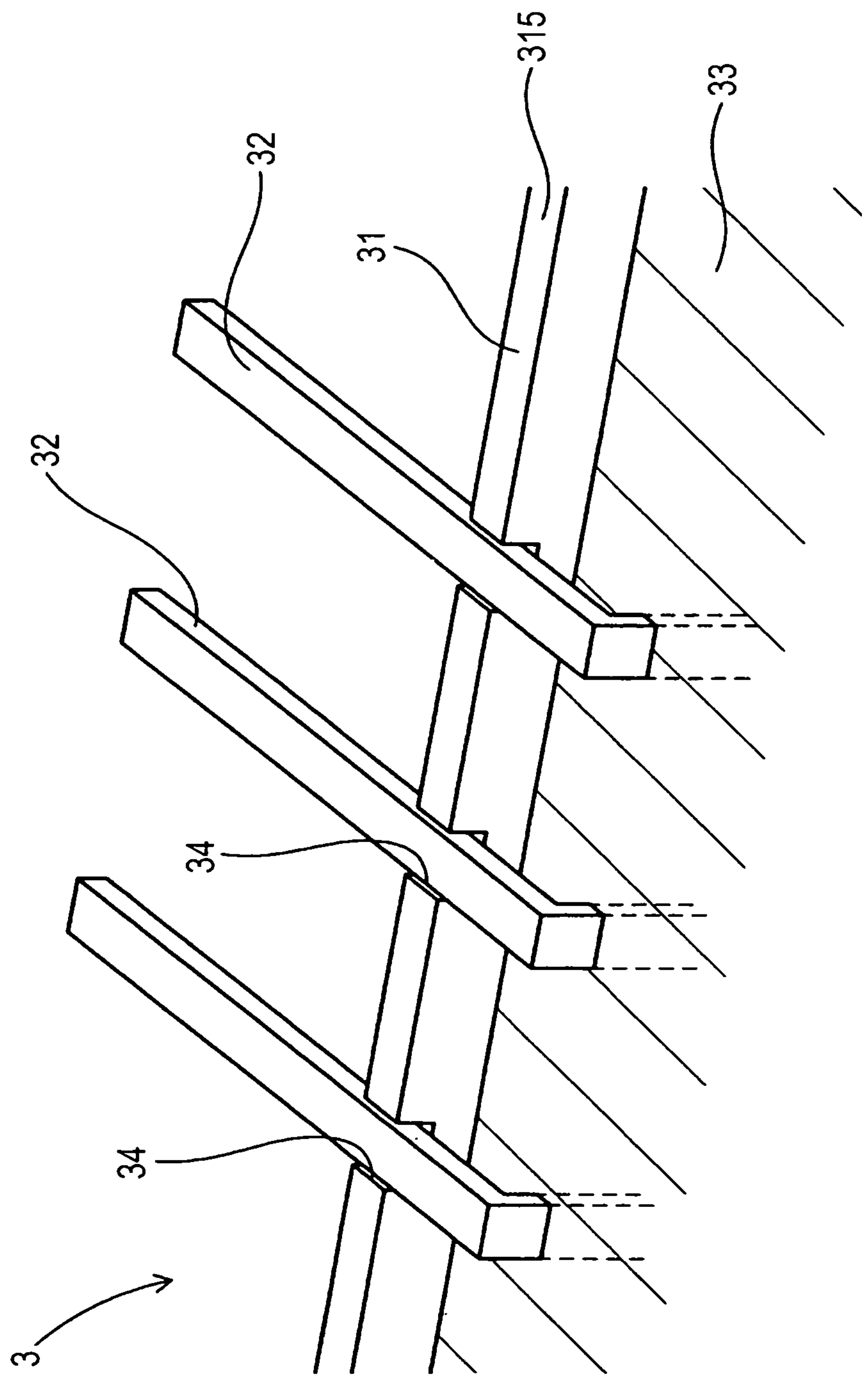
FIG. 7 is a partially enlarged view which illustrates installation of voltage measuring terminals on a casing of a capacitor.

The casing 31 of the capacitor 3 has, as described above, the opening 310. An opening edge 315 of the casing 31, as illustrated in FIG. 7, projects outside the surface of the resinous capsule 33 toward the semiconductor stack 10 (see FIG. 2). The opening edge 315 has formed therein positioning grooves 34 in which the voltage measuring terminals 32 are fit.

The beneficial advantages of the structure of the power converter 1 will be described below.

The power converter 1 has, as described above, the voltage measuring terminals 32 disposed in the capacitor 3. The voltage measuring terminals 32 are oriented to extend in the Z-direction to establish electric connections with the voltage detector 42 on the control circuit board. Similarly, the control terminals 21 of the semiconductor modules 2 are oriented to extend in the Z-direction to establish electric connections with the control circuit 43 on the control circuit board 4. Therefore, in assembling of the power converter 1, the connections of the voltage measuring terminals 32 and the control terminals 21 with the control circuit board 4 may be achieved simultaneously by bring the voltage measuring terminals 32 and the control terminals 21 close to the control circuit board 4 from the Z-direction. This eliminates the need for two discrete steps of connecting the voltage measuring terminals 32 to the control circuit board 4 and connecting the control terminals 21 to the control circuit board 4, thus resulting in a decrease in step of assembling the power converter 1.

Figure 43:
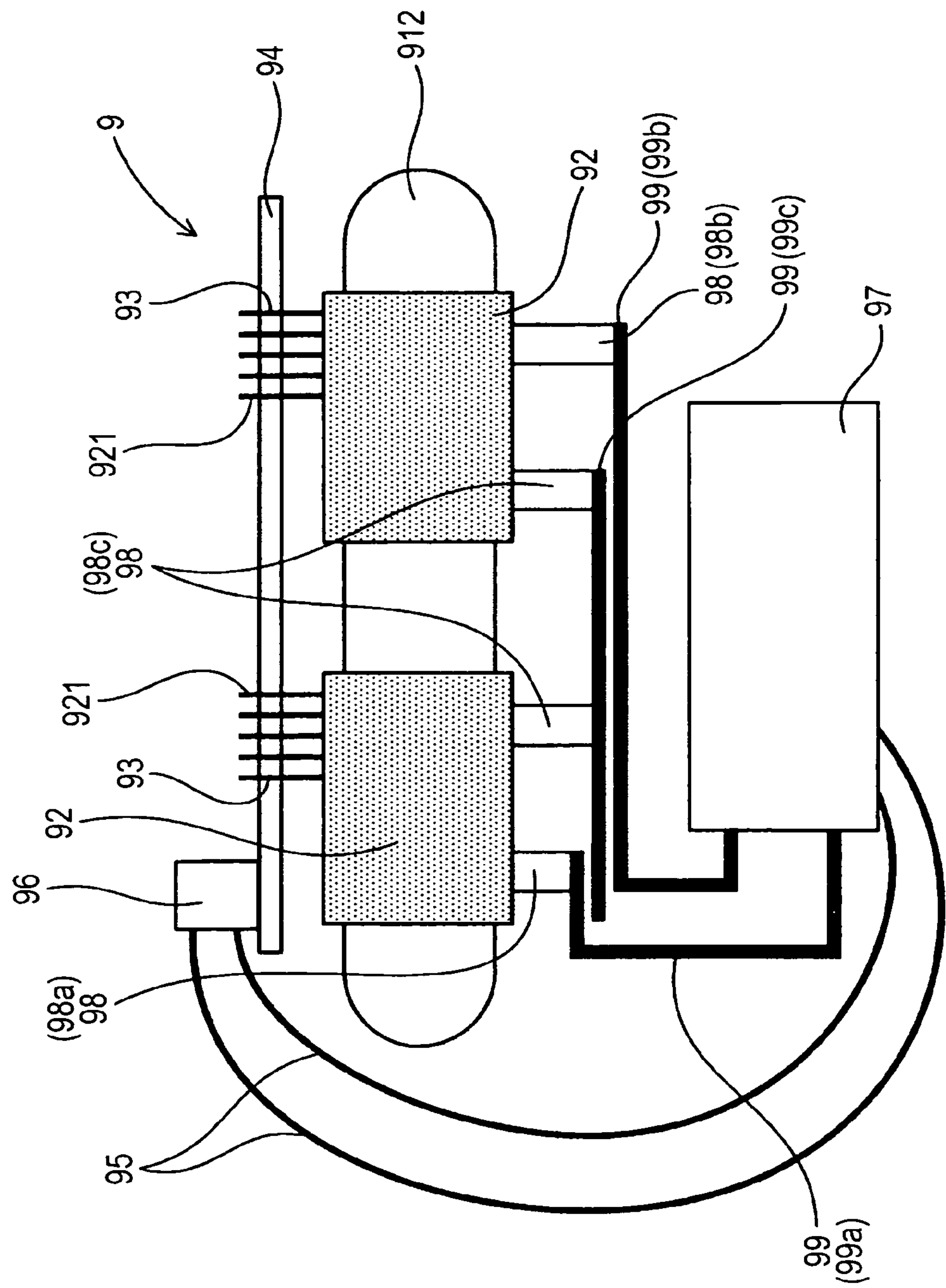
FIG. 43 is a sectional view which illustrates a prior art power converter.

The connection of the capacitor 3 to the voltage detector 41 is achieved without need for an additional step of, for example, drawing the wires 95 from the capacitor 97, as discussed in FIG. 43. The wires 95 are usually flexible. It is, thus, difficult to draw the wires 95 from the capacitor 97 and connect them to the connector 96 automatically. In contrast, the voltage measuring terminals 32 are not flexible, thus facilitating the ease with which the capacitor 3 is joined to the voltage detector 42.

The whole of the voltage measuring terminals 32 is, as already described in FIGS. 1 and 2, laid to overlap with the control circuit board 4, as viewed from the Z-direction. In other words, as viewed from the Z-direction, the voltage measuring terminals 32 are all disposed inside the control circuit board 4, thus permitting the power converter 1 to be reduced in size.

The capacitor 3 and the semiconductor modules 2 are, as clearly illustrated in FIG. 2, disposed adjacent each other in the direction parallel to the major surface 48 of the control circuit board 4, thus permitting them to be arrayed as close to each other as possible, which allows the bus bars 7*a* and 7*b* connecting the capacitor 3 and the semiconductor modules 2 to be decreased in length.

The casing 31, as illustrated in FIG. 2, has the opening 310 through which the capacitor devices 30 are to be installed within the casing 31. The capacitor 3 is fixed with the opening 310 facing the semiconductor modules 2, thus permitting the bus bars 7*a* and 7*b* connecting the capacitor 3 and the semiconductor modules 2 to be decreased in length. This results in a decrease in inductance L of the bus bars 7*a* and 7*b*, which leads to a reduction in surge voltage V (=Ldi/dt) which occurs when the semiconductor modules 2 are turned on or off.

The opening edge 315 of the casing 31, as illustrated in FIG. 7, has formed therein the positioning grooves 34 in which the voltage measuring terminals 32 are fit. Specifically, the voltage measuring terminals 32 are firmly fixed in the positioning grooves 34, so that they are positioned at a desired orientation accurately. This facilitates the ease with which the voltage measuring terminals 32 are positioned relative to the control circuit board 4 and joined thereto in assembling of the power converter 1.

The control circuit 43, as described above, has the high-voltage region 40 and the low-voltage region 41. The voltage detector 42 is disposed on the peripheral area of the low-voltage region 41. In other words, the voltage detector 42 is located adjacent the insulating region 46. This permits an available area of the control circuit board 4 where the electronic parts are to be mounted to be increased. Since the higher voltage is applied to the high-voltage region 40, the insulating region 46 is provided between the high-voltage region 40 and the low-voltage region 41. Similarly, since the higher voltage is applied to the voltage detector 42, the detector insulating region 47 is disposed around the voltage detector 42. It is impossible to mount the electronic parts over the insulating region 46 and the detector insulating region 47. If the voltage detector 42 is disposed in the center of the low-voltage region 41, a need will arise for increasing the size of the detector insulating region 47, so that an area of the low-voltage region 41 occupied by the detector insulating region 47 is increased, thus resulting in a decrease in available area of the control circuit board 4. The voltage detector 42 in this embodiment is, however, disposed on the peripheral area of the low-voltage region 41, thereby decreasing the area of the low-voltage region 41 occupied by the detector insulating region 47. Specifically, the detector insulating region 47 is, as clearly illustrated in FIG. 4, laid to overlap the insulating region 46 partially, so that the overlap 471 serves as both a portion of the insulating region 46 and a portion of the detector insulating region 47, thus resulting in a decreased area of the low-voltage region 41 occupied by the detector insulating region 47, that is, an increased available area of the control circuit board 4.

The voltage detector 42 is, as can be seen in FIG. 4, located adjacent both the side edge 400 of the control circuit board 4 and the insulating region 46, thereby enabling the insulating region 46 and the detector insulating region 47 to overlap each other partially, so that the overlap 471 may be functionally shared by the insulating region 46 and the detector insulating region 47. This results in a decreased area of the control circuit board 4 occupied only by the detector insulating region 47. The area of the voltage detector 42 extends until the side edge 400 of the control circuit board 4. This eliminates the need for the detector insulating region 47 to surround the entire periphery of the voltage detector 42, thereby further decreasing the area of the control circuit board 4 occupied only by the detector insulating region 47, thus resulting in an increase in available area of the control circuit board 4.

The cooling pipes 12 within in which the cooling paths 12 are formed are placed in abutment with the semiconductor modules 2, but however, the cooling paths 12 may alternatively be formed so that the coolant 16 flows in direct contact with the semiconductor modules 2.

The power converter 1 of the second embodiment will be described below which is different in number of the voltage measuring terminals 32 and structure of the control circuit board 4 from the first embodiment.

Each of the semiconductor modules 2 is, like in the first embodiment, equipped with the plurality of control terminals 21 (see FIG. 6). One of the control terminals 21 (i.e., the kelvin emitter KE of the lower-arm semiconductor device 23*b*) is at the same potential as the negative terminal 20*b*. The kelvin emitter KE (i.e., a lower-potential terminal 210) is, thus, connected to the lower-potential electrodes 38*b* of the capacitor devices 30 through the negative bus bar 7*b*, as illustrated in FIG. 2.

The capacitor 3 has the two voltage measuring terminals 32 one of which is coupled to the high potential electrode 38*a* of the filter capacitor device 30*a*, as illustrated in FIG. 5, and the other of which is coupled to the high potential electrode 38*a* of the main capacitor 30*b*.

Figure 8:
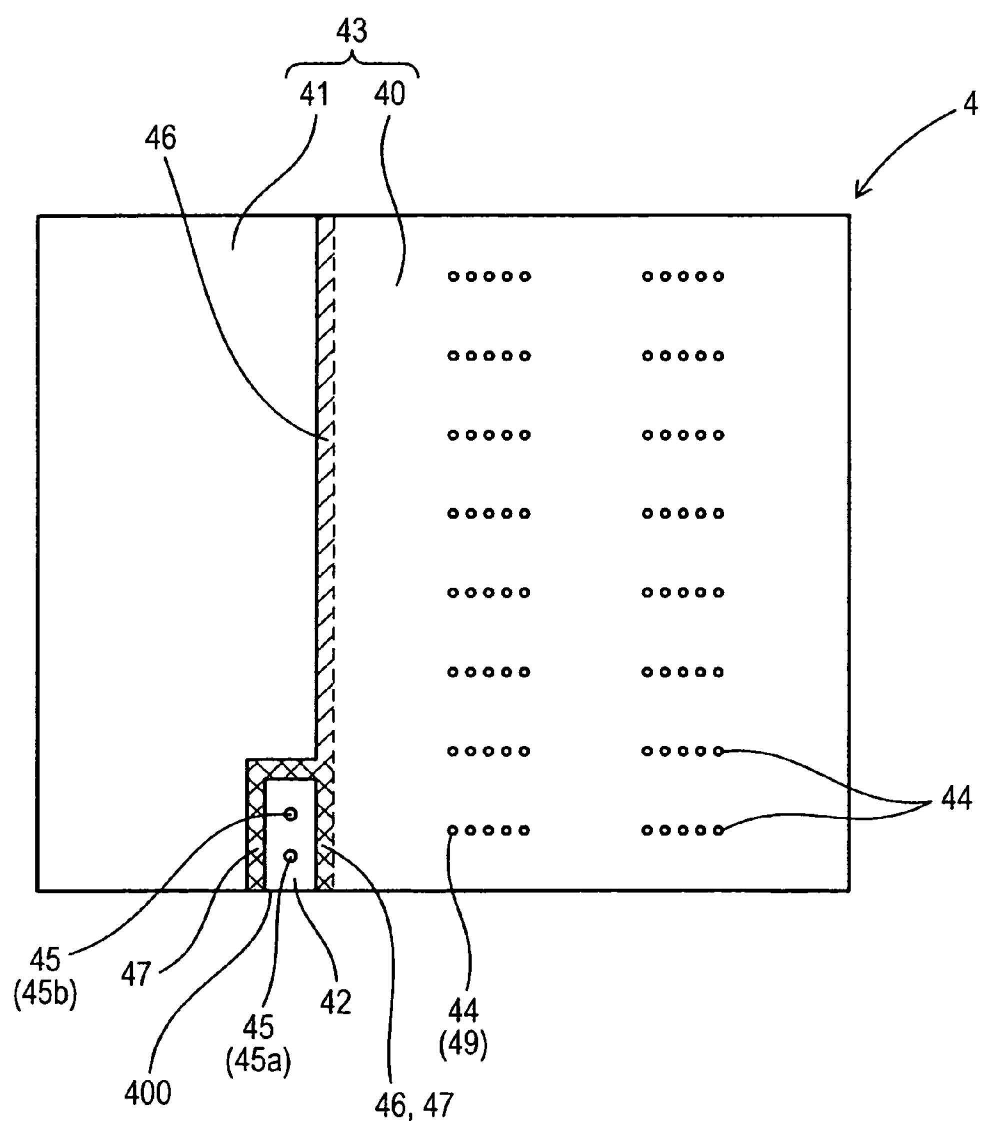
FIG. 8 is a plan view which illustrates a control circuit board of the second embodiment.

The control circuit board 4, as clearly illustrated in FIG. 8, has formed therein two holes 45 (45*a*, 45*b*) through which the above two voltage measuring terminals 32 of the capacitor 3 pass.

The high-voltage region 40 of the control circuit board 4, like in the first embodiment, has a plurality of through holes 44 formed therein. The low-potential terminal 210 (i.e., the kelvin emitter KE of the lower-arm semiconductor device 23*b* of each of the semiconductor modules 2) is inserted into a terminal connector 49 that is one of the holes 44.

The voltage detector 42 is, like in the first embodiment, disposed adjacent the terminal connector 49. The voltage detector 42 is also located on a peripheral area of the low-voltage region 41.

At least one of the terminal connectors 49 and the voltage detector 42 are coupled through wire (not shown). The voltage detector 42 is implemented by a voltage divider which measures voltages developed across the one of the terminal connectors 49 and the holes 45. Specifically, the voltage divider uses the low-potential terminal 210 inserted into the terminal connector 49 and the voltage measuring terminals 32 inserted into the holes 45 to monitor the before-stepped up voltage $V_L$ and the after-stepped up voltage $V_H$, as appearing at the capacitor devices 30. All of the terminal connectors 49 may be coupled electrically to the voltage detector 42.

Other arrangements are identical with those in the first embodiment, and explanation thereof in detail will be omitted here.

The structure of the power converter 1 of the second embodiment is, as discussed above, designed to use a portion of the control terminals 21 (i.e., the low-potential terminals 210) of the semiconductor modules 2 to measure the voltages appearing at the capacitor devices 30, thus permitting the number of the voltage measuring terminals 32 to be decreased as compared with the first embodiment equipped with the three voltage measuring terminals 32.

The voltage detector 42 is disposed adjacent or close to the low-potential terminals 210, thus permitting the length of wire used to connect the voltage detector 42 and the low-potential terminals 210 to be shortened on the control circuit board 4.

Figure 9:
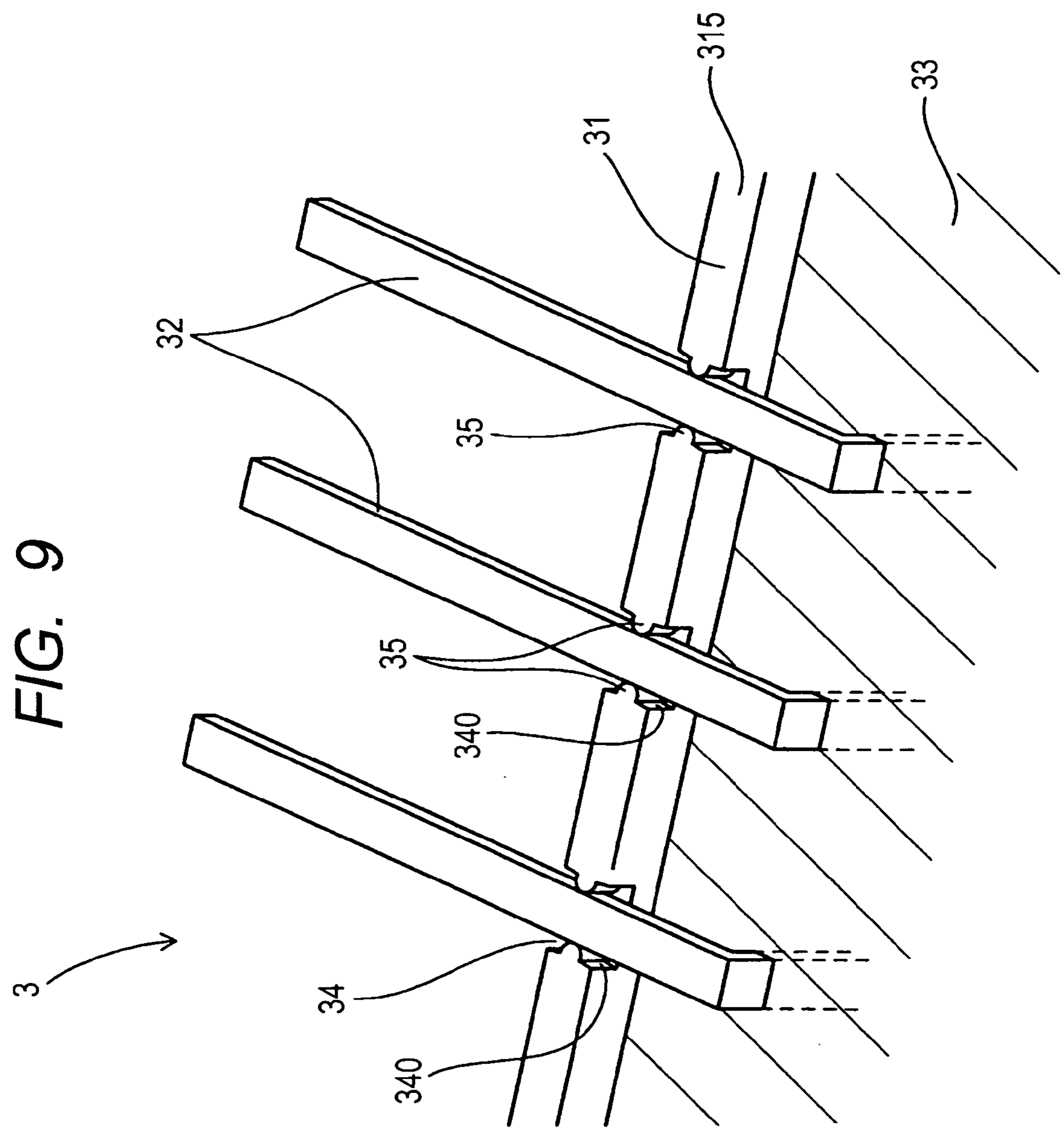
FIG. 9 is a partially enlarged view which illustrates installation of voltage measuring terminals on a casing of a capacitor.
Figure 10:
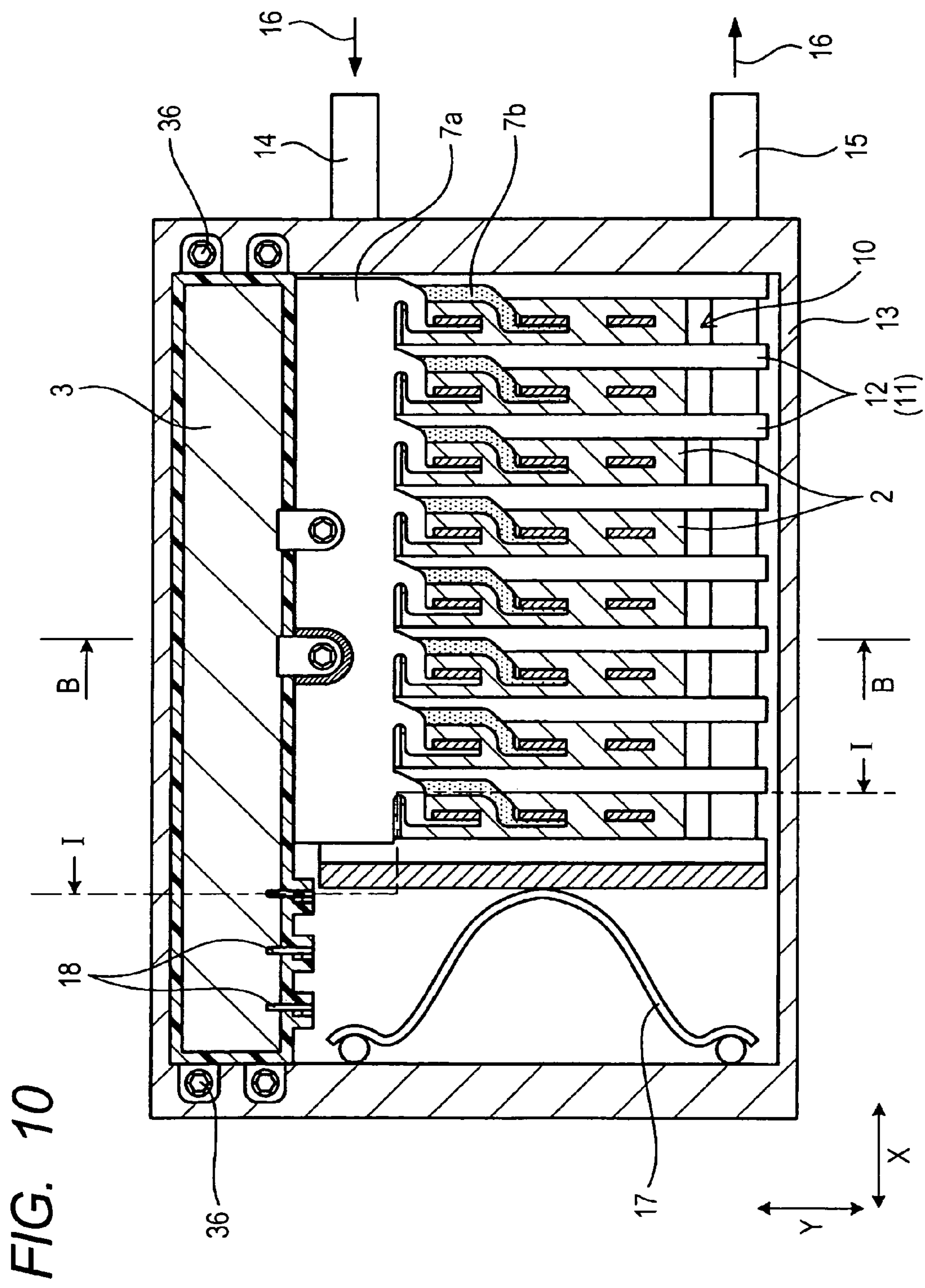
FIG. 10 is a plan view which illustrates a power converter according to the fourth embodiment.

The power converter 1 of the third embodiment will be described below with reference to FIG. 9 which is different in configuration of the capacitor 3 from the first embodiment.

The opening edge 315 of the capsule 33 has, like in the first embodiment, formed therein positioning grooves 34 in which the voltage measuring terminals 32 are retained. Each of the positioning grooves 34 has a pair of ridge-like protrusions 35 formed on opposed inner side walls 340 of the groove 34. The protrusions 35 face each other across the width of the positioning groove 34 and serve to create a tight grip through which a corresponding one of the voltage measuring terminals 32 passes.

Other arrangements are identical with those in the first embodiment, and explanation thereof in detail will be omitted here.

The structure of the power converter 1 of the third embodiment is, as discussed above, designed to have the protrusions 35 formed on each of the positioning grooves 34 to hold the width of the voltage measuring terminal 32 without any play, thereby improving the resistance of the voltage measuring terminal 32 to mechanical vibration and the accuracy in positioning the voltage measuring terminal 32. This facilitates the ease with which the voltage measuring terminals 32 are positioned relative to the control circuit board 4 and joined thereto in assembling of the power converter 1. The power converter 1 of the third embodiment also offers the same other advantages as in the first embodiment.

The power converter 1 of the fourth embodiment will be described below with reference to FIGS. 10 to 15 which is different in configuration of the capacitor 3 from the first embodiment.

Figure 11:
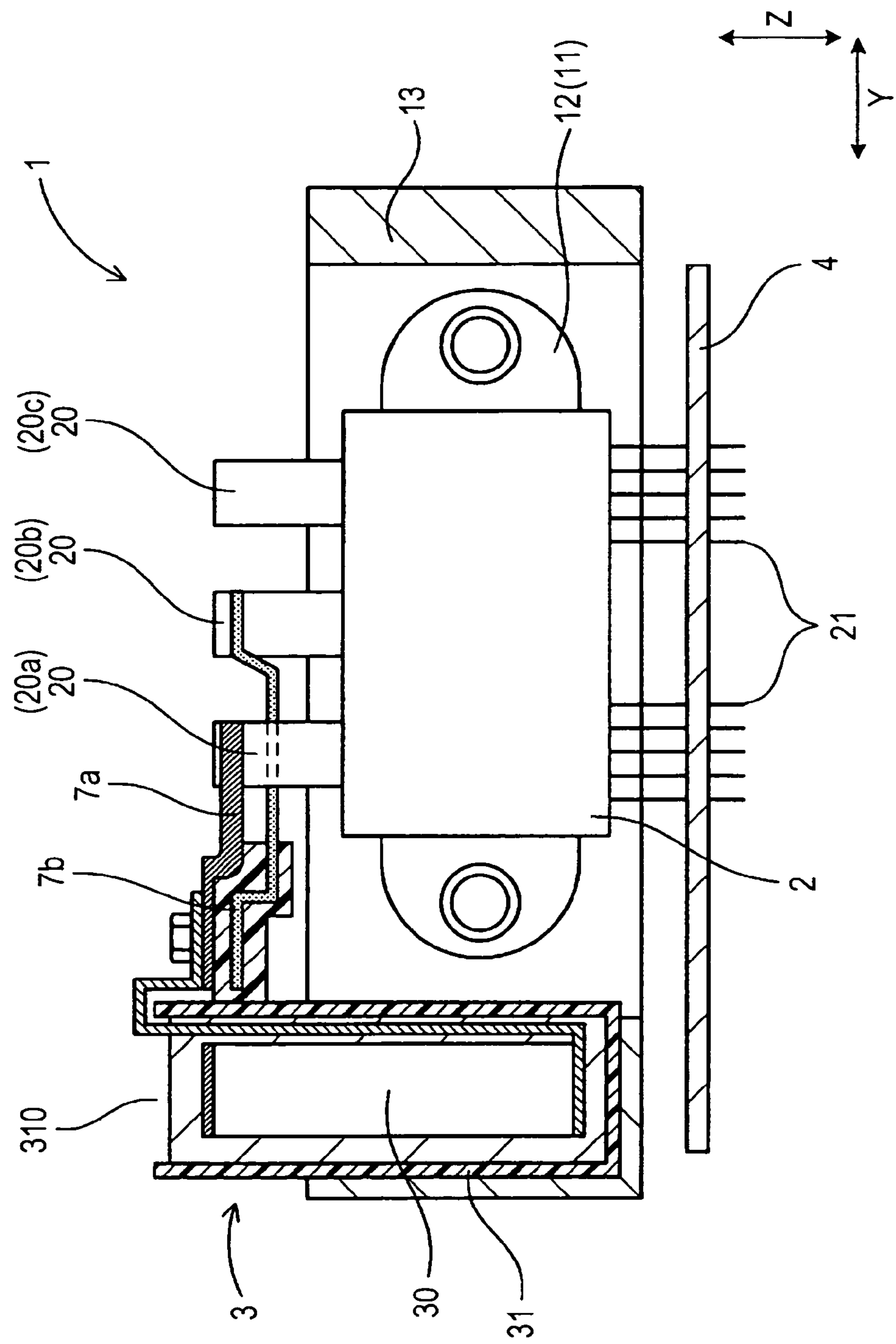
FIG. 11 is a sectional view taken along the line B-B in FIG. 10.
Figure 12:
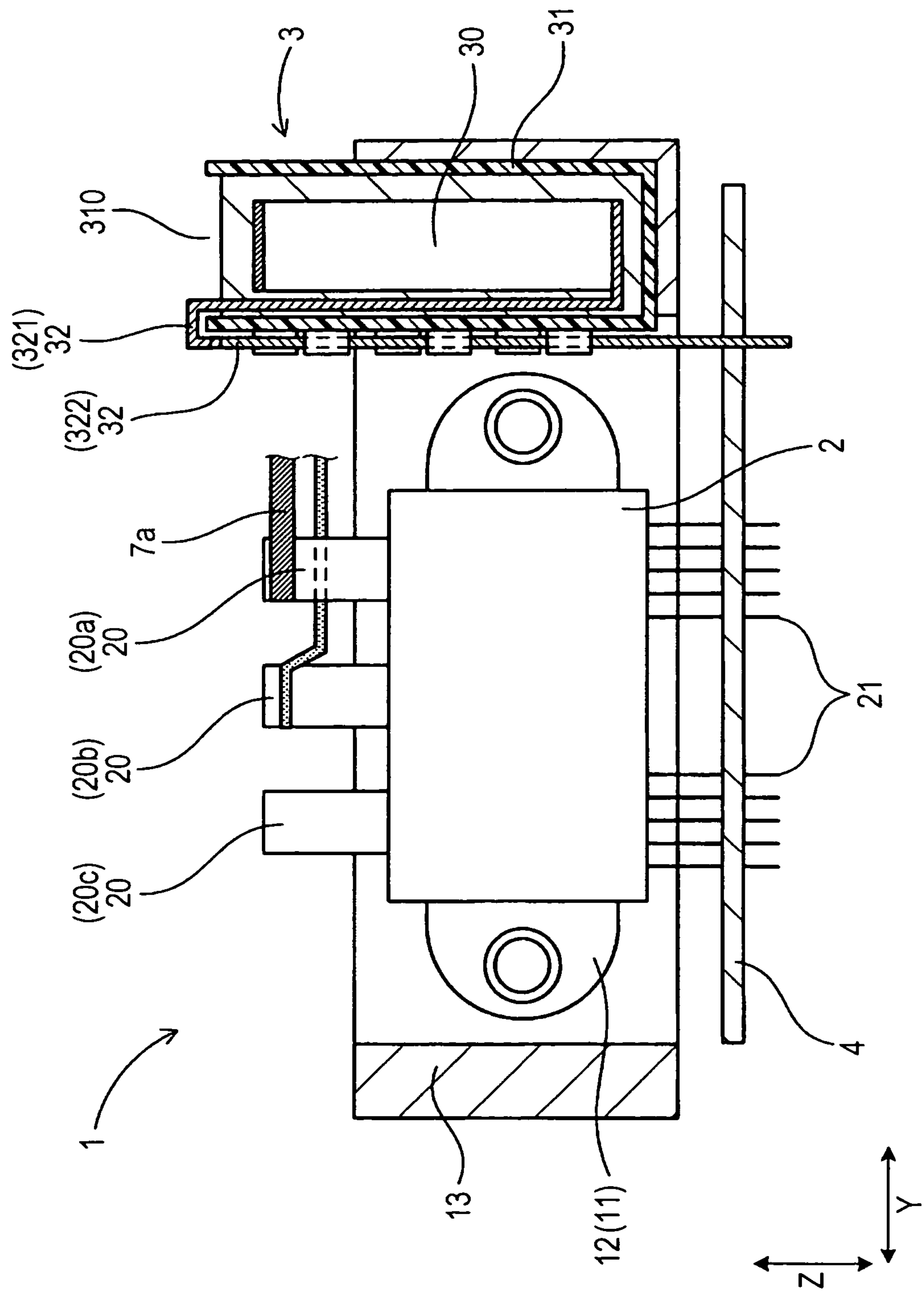
FIG. 12 is a sectional view taken along the line I-I in FIG. 10.

The casing 31 has the opening 310, as can be seen in FIG. 11, formed in one of the ends thereof opposed in the Z-direction. Specifically, the opening 310 faces in a direction opposite the control circuit board 4. Each of the voltage measuring terminals 32 is, as illustrated in FIGS. 12 to 15, made up of a first section 321 leading to the capacitor device 30 and a second section 322 as a discrete member separate from the first section 321. The second section 322 is welded to the first section 321 and joined to the control circuit board 4.

Figure 14:
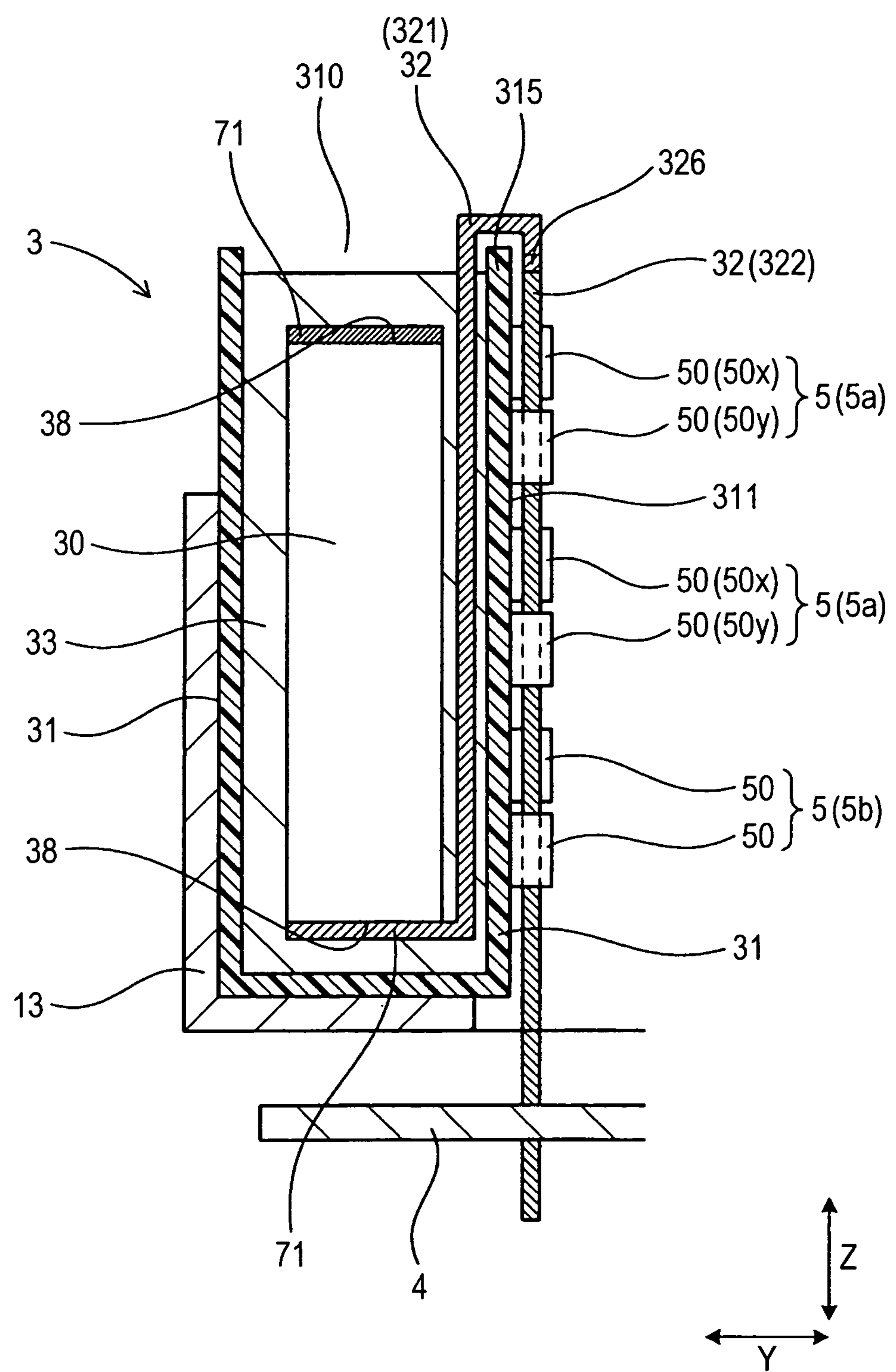
FIG. 14 is an illustration as viewed from an arrow C in FIG. 10.
Figure 15:
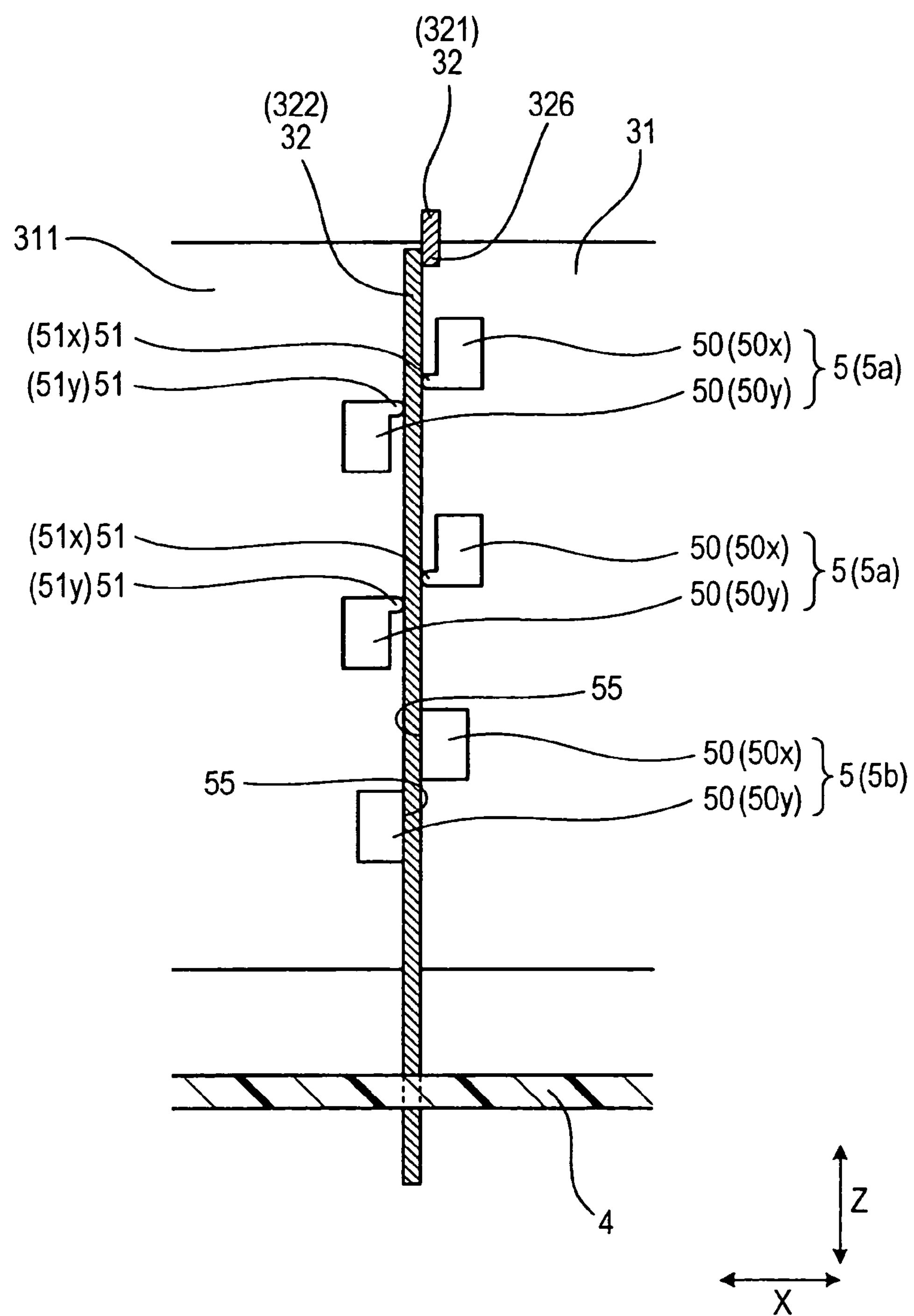
FIG. 15 is an illustration as viewed from an arrow D in FIG. 10.

The first section 321 is, as illustrated in FIG. 14, connected to the electrode 38 of the capacitor device 30. The first section 321 has a plurality of bends. Specifically, the first section 321 is of a substantially L-shape and extends from a capacitor connecting portion 71 in the Z-direction. The capacitor connecting portion 71 is joined to the electrode 38 of the capacitor device 30. The first section 321 also projects outside the opening 310 of the casing 31, extends, as clearly illustrated in FIG. 12, in the Y-direction toward the semiconductor modules 2, and then is bent toward the control circuit board 4 in the Z-direction. The first section 321 has an end 326 is located near the opening edge 315 of the casing 31. The end 326 is welded to the second section 322 to join the first and second sections 321 and 322 together. The second section 322, as illustrated in FIGS. 14 and 15, extends straight in the Z-direction and connects at an end thereof with the control circuit board 4. The first section 321 and the second section 322 are each made of a metallic plate or strip.

The casing 31 has, as illustrated in FIGS. 14 and 15, an outer wall 311 on which terminal holders 5 are formed. Each of the terminal holders 5 also works as a terminal mount and is made up of a pair of protrusions 50 which hold a portion of the voltage measuring terminal 32 (i.e., the second section 322) firmly therebetween. The protrusions 50 of each of the terminal holders 5 are, as can be seen in FIG. 15, offset from each other in the Z-direction. Specifically, the protrusions 50 of each of the terminal holders 5 are upper and lower protrusions 50*x* and 50*y* with projections or salients 51*x* and 51*y* which will be generally denoted by reference number 51. The salients 51*x* and 51*y* are formed on opposed surfaces of the upper and lower protrusions 50*x* and 50*y* and arrayed out of alignment with each other in the X-direction. In other words, the salient 51*x* is located closer to the opening 310 of the casing 31 than the salient 51*y*. The salients 51*x* and 51*y* are placed in direct abutment with the voltage measuring terminal 32.

The outer wall 311 of the casing 31 has the three terminal holders 5 for each of the voltage measuring terminals 32 in this embodiment. The terminal holders 5 are, as can be seen from FIGS. 14 and 15, broken down into two types: one is a projecting terminal holder 5*a* and the other is a flat face-terminal holder 5*b*. The two projecting terminal holders 5*a* and the one flat face-terminal holder 5*b* are disposed on the outer wall 311 for each of the voltage measuring terminal 32. Each of the projecting terminal holders 5*a* is, as described above, made of the upper and lower protrusions 50*x* and 50*y* with the salients 51*x* and 51*y* which create a nip through which the second section 322 of the voltage measuring terminal 32 passes. The flat face-terminal holder 5*b* is made up of the upper and lower protrusions 50*x* and 50*y* with flat faces 55 placed in direct surface contact with the second section 322 of the voltage measuring terminal 32. The area of the flat face-terminal holder 5*b* which is in contact with the voltage measuring terminal 32 is, thus, greater than those of the projecting terminal holders 5*a*, thereby ensuring the stability in orientation of the voltage measuring terminal 32. The flat face-terminal holder 5*b* is closer to the control circuit board 4 than the projecting terminal holders 5*a*.

Figure 13:
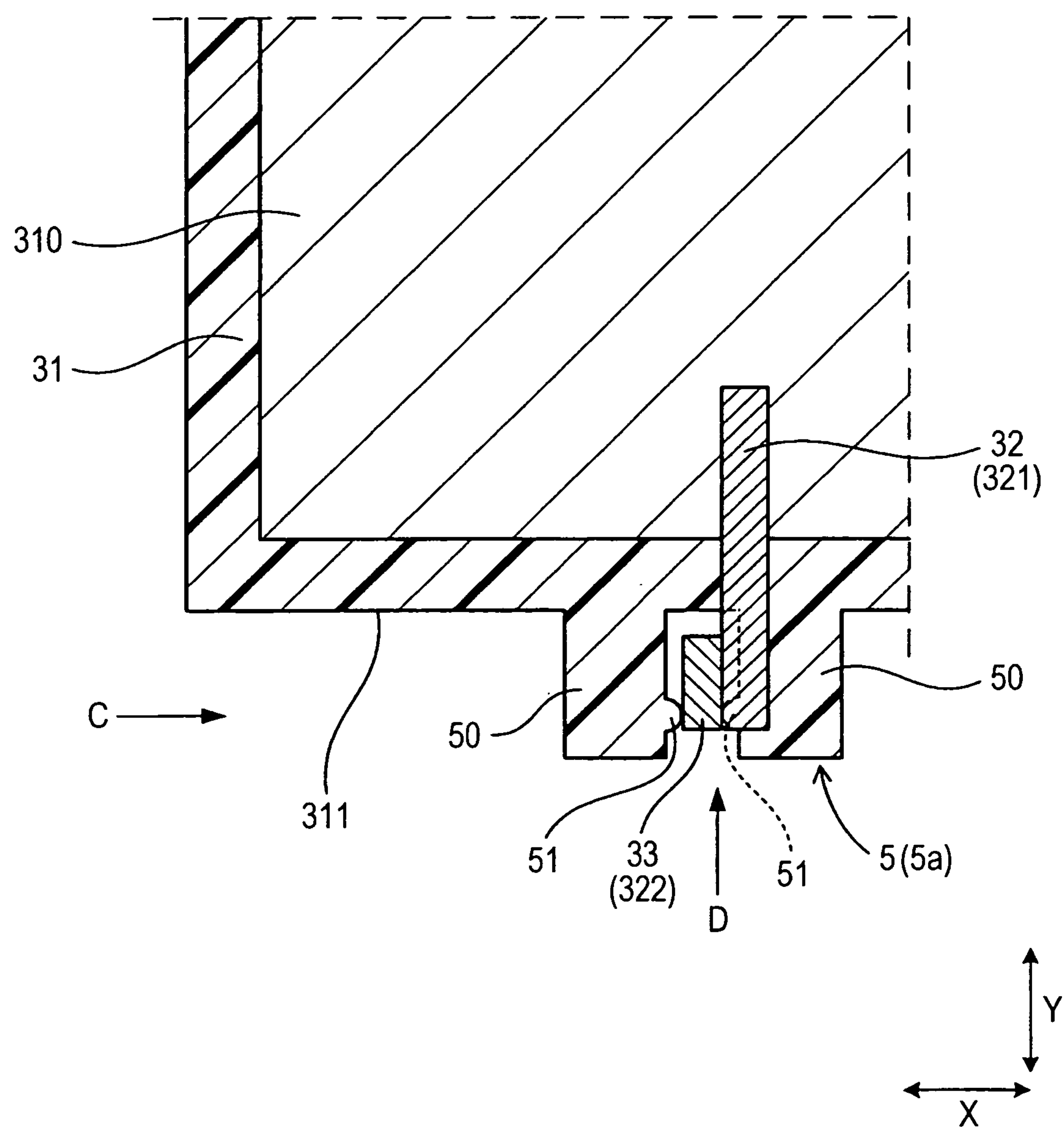
FIG. 13 is a partially enlarged view which illustrates installation of voltage measuring terminals on a casing of a capacitor in FIG. 10.

The second section 322 of each of the voltage measuring terminals 32 is, as clearly illustrated in FIG. 13, of a rectangular shape in cross section. The two protrusions 50 of each of the terminal holder 5 work to nip the width of the second section 322 in the X-direction, thereby retaining the voltage measuring terminal 32 firmly on the outer surface of the casing 31.

Other arrangements are identical with those in the first embodiment, and explanation thereof in detail will be omitted here.

The structure of the power converter 1 of the fourth embodiment has the beneficial advantages as discussed below.

Figure 42:
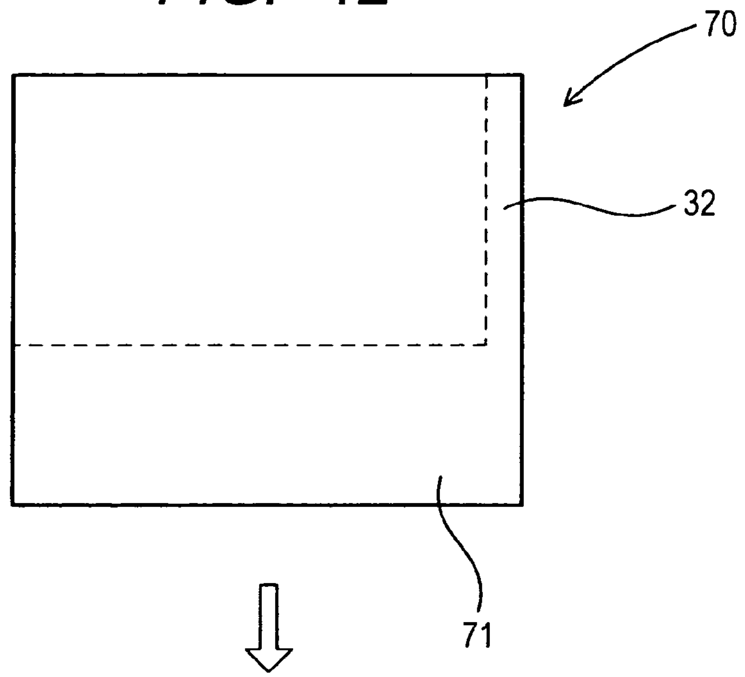
FIG. 42 is an illustration which shows how to produce a comparative example of a voltage measuring terminal.
Figure 42:
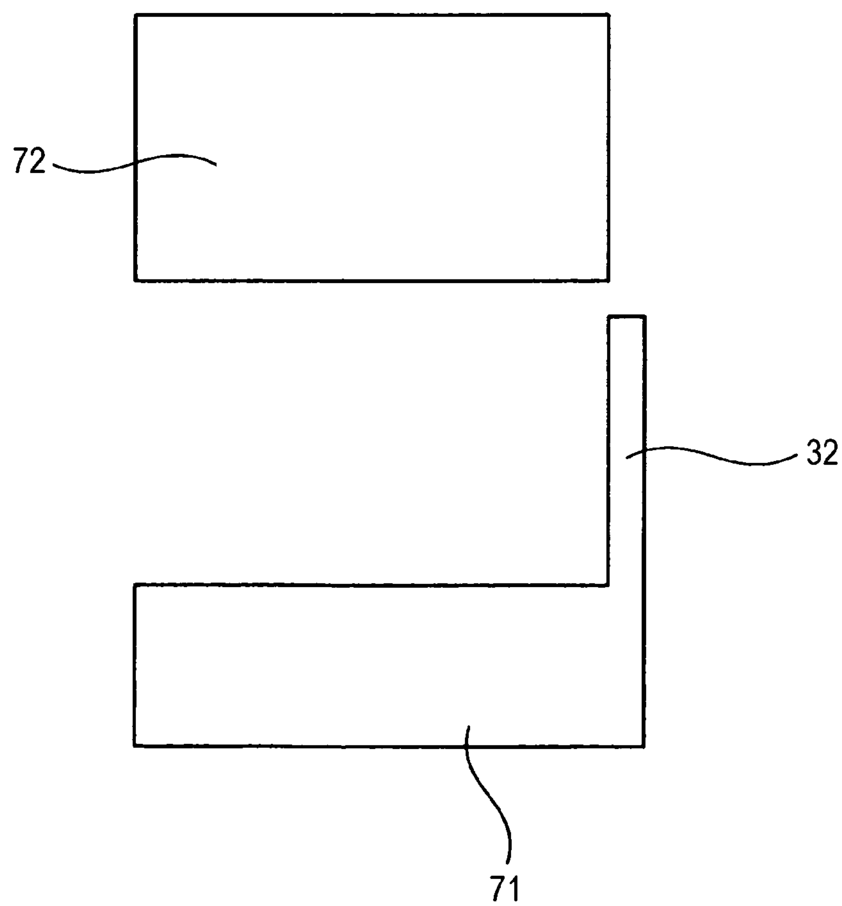

Each of the voltage measuring terminals 32 is, as already described with reference to FIGS. 13 to 15, made up of two parts: the first section 321 and the second section 322 which are welded together. This results in a decrease in production cost of the power converter 1. Specifically, it is necessary to make the voltage measuring terminal 32 to integrally include a portion (i.e., the capacitor connecting portion 71) which is to be in electric contact with the electrode of the capacitor device 30. If the voltage measuring terminal 32 is made of a one-piece strip, it will be longer than each of the first and second sections 321 and 322. For instance, when the measuring terminal 32 is cut out, as illustrated in FIG. 42, from a metal plate 70 into an L-shape, it produces a large useless portion 72. The structure of the voltage measuring terminal 32 in this embodiment is designed to eliminate such a problem. The voltage measuring terminal 32 is, as described above, made up of two discrete parts: the first and second sections 321 and 322, so that the length of the first section will be shorter than an overall length of the voltage measuring terminal 32. The second section 322 may be made using a separate strip member. It is, thus, possible to minimize the area of the useless portion 72. This results in a decrease in production cost of the voltage measuring terminals 32.

The casing 31 has, as illustrated in FIG. 15, formed on the outer wall 311 of the casing 31 the terminal holders 5 each made up of the pair of protrusions 50. The pair of protrusions 50 has the salient 51*x* and 51*y* or the flat faces 55 to retain the voltage measuring terminal 32 (i.e., the second section 322) firmly on the casing 31. One of the salients 51*x* and 51*y* of the protrusions 50 of each of the terminal holders 5 is offset or staggered from the other one of the salient 51*x* and 51*y* in the lengthwise direction of the voltage measuring terminal 32, thereby ensuring the enhanced stability in retaining the voltage measuring terminal 32 on the casing 31, which improves the accuracy in positioning the voltage measuring terminal 32 to facilitate the ease with which the voltage measuring terminal 32 is joined to the control circuit board 4. The casing 31 is made of resin and has the advantage that it is insusceptible to breakage. If the salients 51*x* and 51*y* are arrayed in alignment with each other in the X-direction, it will result in a decreased linear interval therebetween. This requires the need for using resin-molding dies in which projections for forming the salient 51*x* and 51*y* are located close to each other to make the casing 31. The decreasing of the linear interval between the salient 51*x* and 51*y* requires the salient-forming projections to have a decreased width, which will be subjected to breakage during use. In contrast, the salient 51*x* and 51*y* of the protrusions 50 of the terminal holder 5 are offset from each other in the Z-direction to increase the liner interval therebetween, thus enabling the distance between the salient-forming projections of the resin-molding dies to be increased to avoid the breakage thereof in the course of forming the casing 31.

The terminal holders 5 are, as already described in FIG. 15, broken down into two types: the projecting terminal holder 5*a* and the flat face-terminal holder 5*b*. The flat face-terminal holder 5*b* is made up of the upper and lower protrusions 50*x* and 50*y* with the flat faces 55 placed in direct surface contact with the second section 322 of the voltage measuring terminal 32 and located closer to the control circuit board 4 than the projecting terminal holders 5*a*. The area of the flat face-terminal holder 5*b* which is in contact with the voltage measuring terminal 32 is greater than those of the projecting terminal holders 5*a*, thereby ensuring the stability in orientation of the voltage measuring terminal 32 and enhancing the resistance thereof to the mechanical vibration.

The salients 51*x* and 51*y* of the terminal holder 5 are shifted from each other, in other words, arranged out of alignment with each other in the direction perpendicular to the length of a corresponding one of the voltage measuring terminals 32. The holding of the voltage measuring terminal 32 by the salients 51*x* and 51*y* may, therefore, result in bending thereof. In order to alleviate this problem, each of the sets of the terminal holders 5 has at least the one flat face-terminal holder 5*b* to hold the voltage measuring terminal 32 by the flat faces 55 placed in direct contact therewith, thereby enhancing the stability in retaining and the accuracy in positioning the voltage measuring terminal 32 on the casing 31 to facilitate the ease with which the voltage measuring terminal 32 is joined to the control circuit board 4.

The power converter 1 of the fourth embodiment also offers the same other advantages as in the first embodiment.

Figure 16:
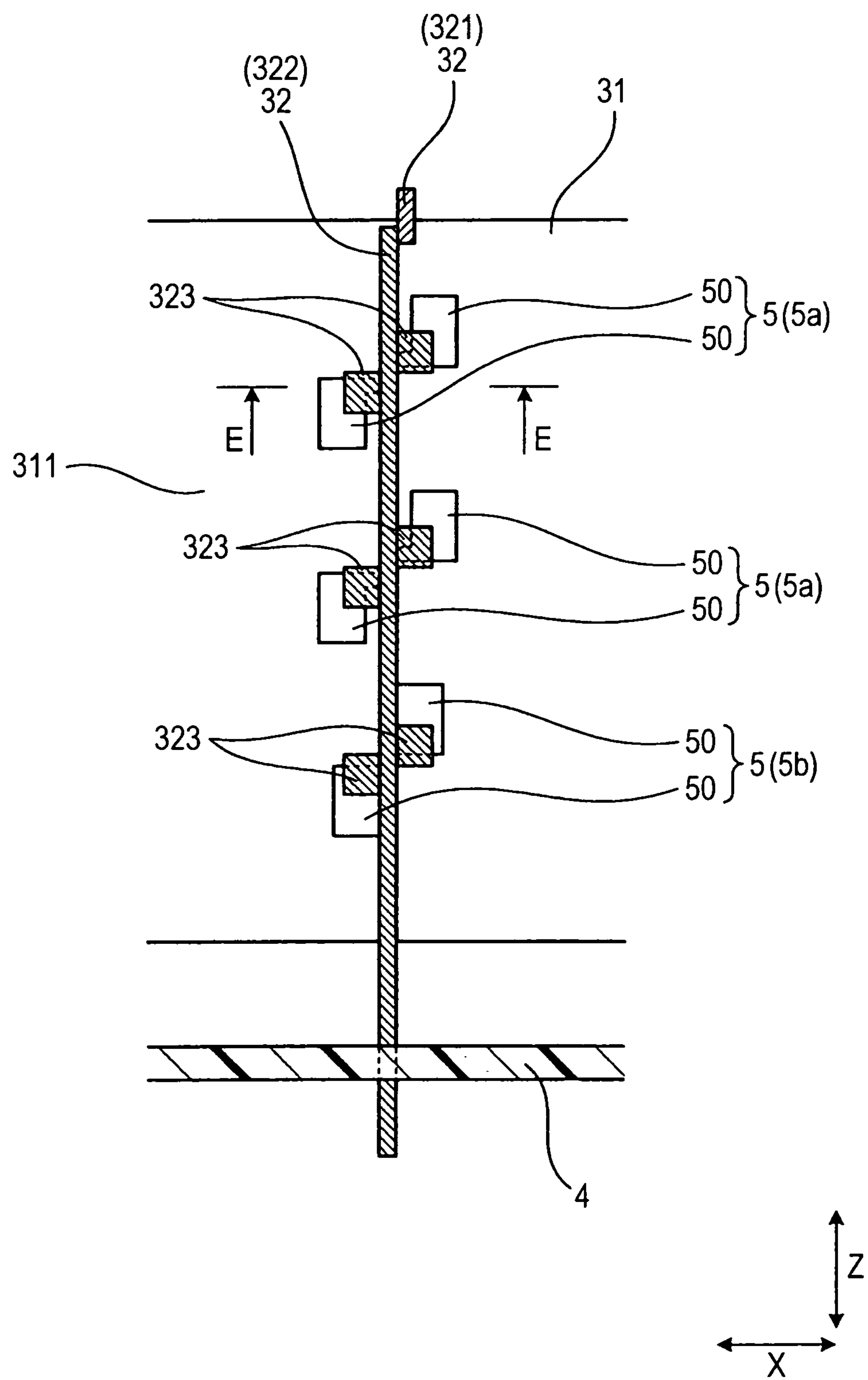
FIG. 16 is a partial view which shows terminal holders to hold voltage measuring terminals on a capacitor in the fifth embodiment.
Figure 17:
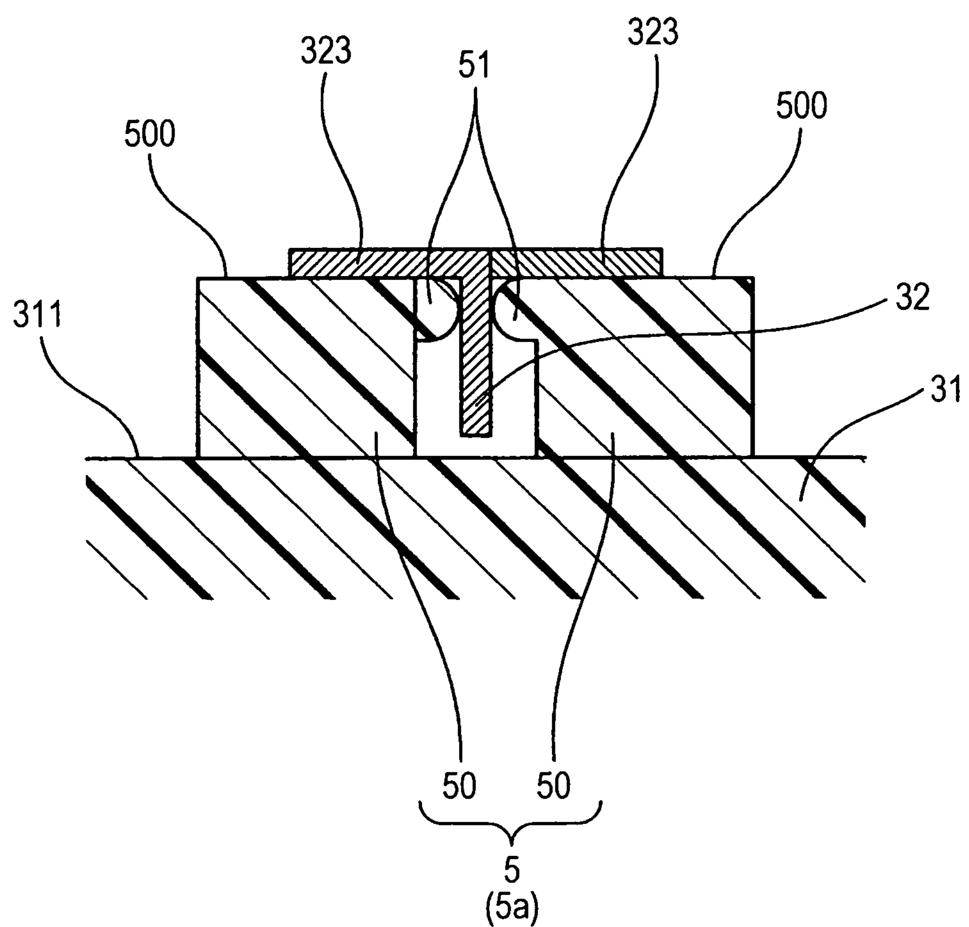
FIG. 17 is a sectional view as taken along the line E-E in FIG. 16.

The power converter 1 of the fifth embodiment will be described below with reference to FIGS. 16 and 17 which is different in configuration of the voltage measuring terminals 32 from the first embodiment.

Each of the voltage measuring terminals 32 is equipped with reinforcement ribs 323 formed on portions thereof retained by the terminal holder 5. The reinforcement ribs 323 extend substantially parallel to the outer wall 311 of the casing 31. The voltage measuring terminal 32, as clearly illustrated in FIG. 16, has the reinforcement ribs 323 one for each of the terminal holders 5 (i.e., the pair of protrusions 50). Each of the reinforcement ribs 323 is formed by a tab extending from the second section 322 of the voltage measuring terminal 32 perpendicular to the length of the second section 322. The two of the reinforcement ribs 323 for each of the terminal holders 5 extend in opposite directions. The reinforcement ribs 323 are, as can be seen in FIG. 17, placed in direct contact with outer surfaces 500 of the protrusions 50.

Each of the reinforcement ribs 323 works to increase the mechanical strength of the voltage measuring terminal 32, which increases the resistance of the voltage measuring terminal 32 to bending thereof when inserted and held between the protrusions 50 of the terminal holder 5. This results in improvement of stability of orientation of the voltage measuring terminal 32, thereby facilitating the ease with which the voltage measuring terminal 32 is joined to the control circuit board 4.

Figure 18:
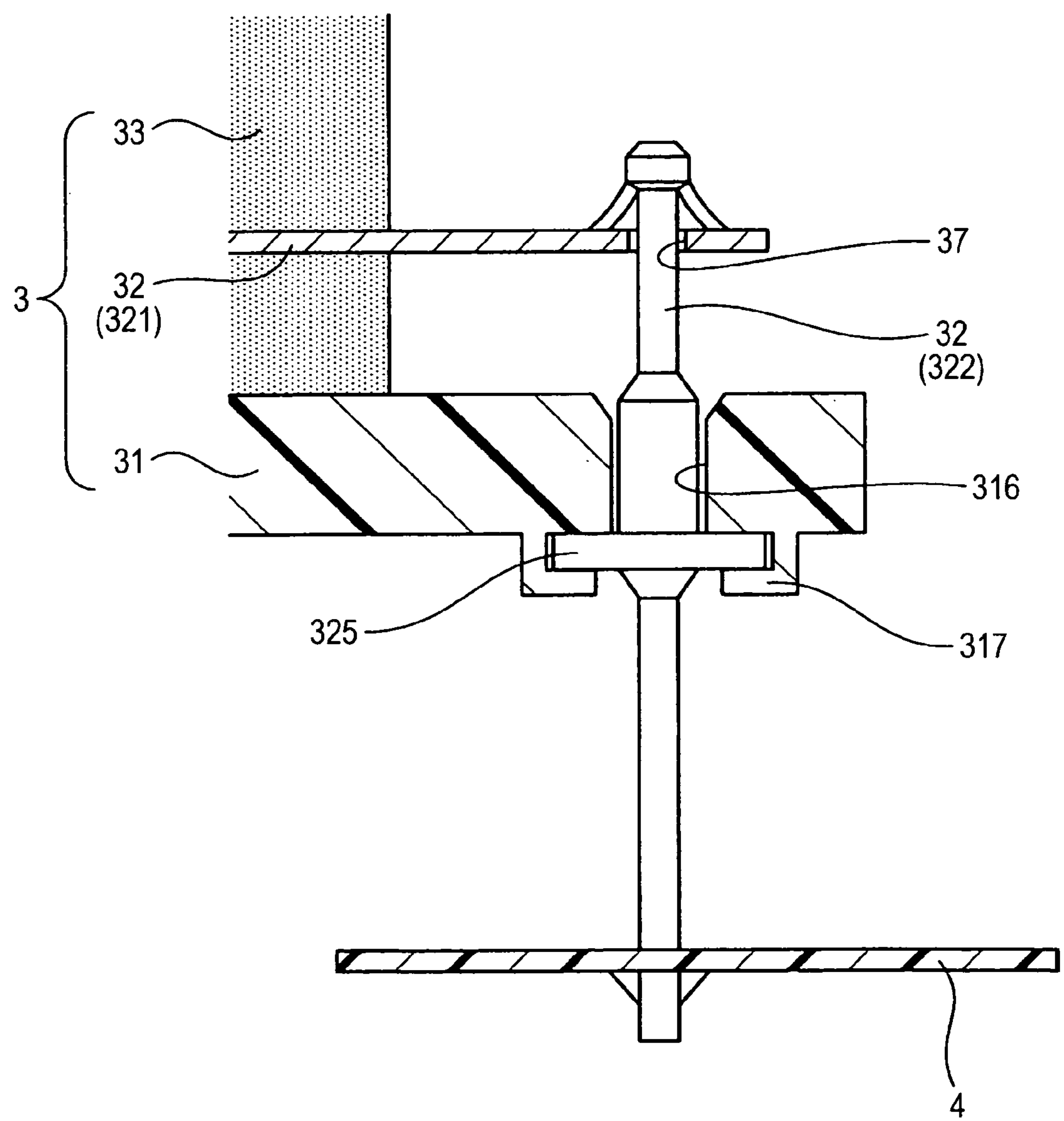
FIG. 18 is a partial view which illustrates a structure of a voltage measuring terminal and an installation of the voltage measuring terminal in a casing of a capacitor in the sixth embodiment.

The power converter 1 of the sixth embodiment will be described below with reference to FIGS. 18, 19, and 20 which is different in structure of the voltage measuring terminals 32 from the first embodiment.

Each of the voltage measuring terminals 32 is, like in the fourth embodiment, made up of two parts: the first section 321 and the second section 322. The first section 321 has formed therein a cut-out hole 37 in which an end of the second section 322 is fit to establish electrical connection between the first section 321 and the second section 322.

The casing 31 of the capacitor 3 has formed therein a hole 316 through which the second section 322 passes. The second section 322 has a flange 325. The casing 31 has a hook or claw 317 which locks the flange 325 of the second section 322 to hold the second section 322 firmly.

Figure 19:
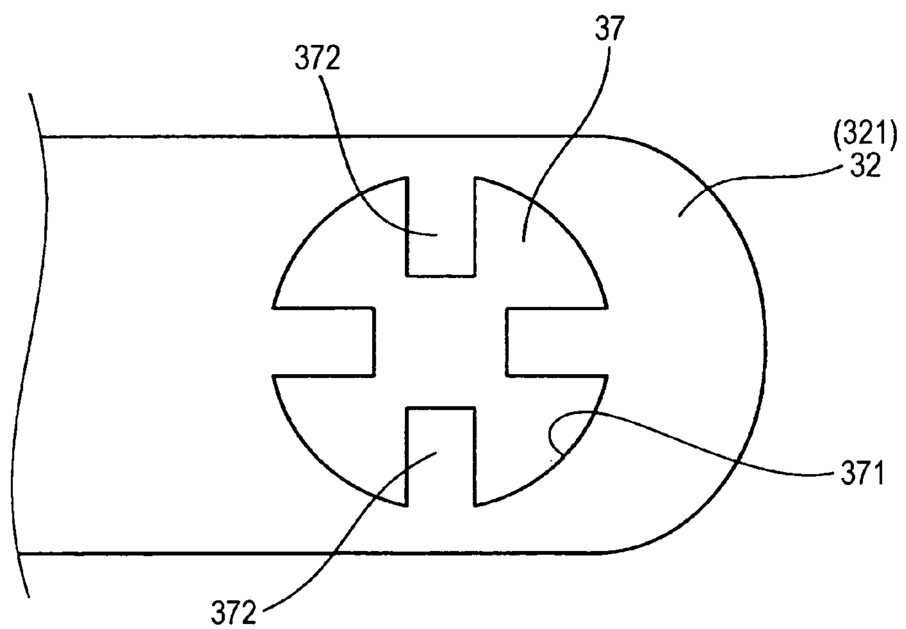
FIG. 19 is a partially enlarged view which illustrates a structure of a first section of the voltage measuring terminal of FIG. 18.
Figure 20:
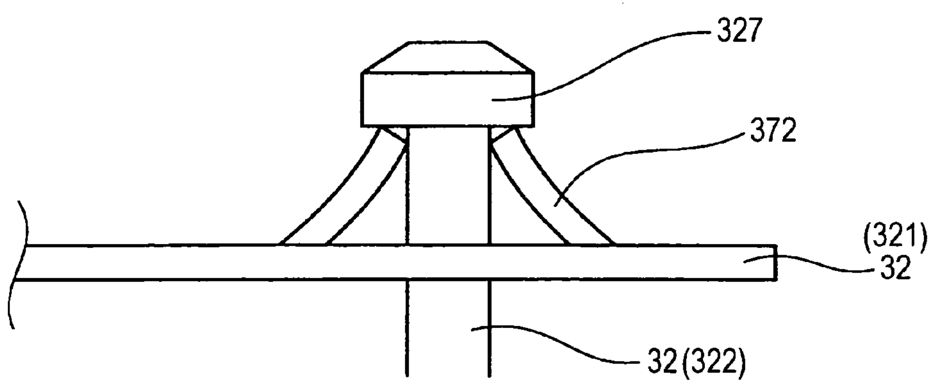
FIG. 20 is a partially enlarged view which illustrates a joint of a first and a second section of the voltage measuring terminal of FIG. 18.

The cut-out hole 37 of the first section 321 of the voltage measuring terminal 32 has, as can be seen in FIGS. 19 and 20, arc-shaped inner walls 371 and four inner tabs or protrusions 372 each of which extends inwardly radially from between adjacent two of the arc-shaped inner walls 371. The second section 322 has formed on an end thereof a flange head 327 which has an outer diameter smaller than the distance between diametrically opposed two of the inner protrusions 372 of the first section 321. The mechanical/electrical joint between the first and second sections 321 and 322 is achieved by inserting the flange head 327 into the center of the cut-out hole 37 and then thrusting it while elastically pushing the inner protrusions 372 until the inner protrusion 372 are snap fit on the jaw of the flange head 327 of the second section 322.

Other arrangements are identical with those in the first embodiment, and explanation thereof in detail will be omitted here.

The structure of the voltage measuring terminal 32 of this embodiment establishes the mechanical/electrical connection of the first and second sections 321 and 322 without use of welding techniques, thus facilitating the ease of assembling of the voltage measuring terminal 32, and permits, like in the third embodiment, the first section 321 to be decreased in length to increase the area of the useless portion 72. This results in a decrease in production cost of the voltage measuring terminals 32.

The power converter 1 of the sixth embodiment also offers the same other advantages as in the first embodiment.

Figure 21:
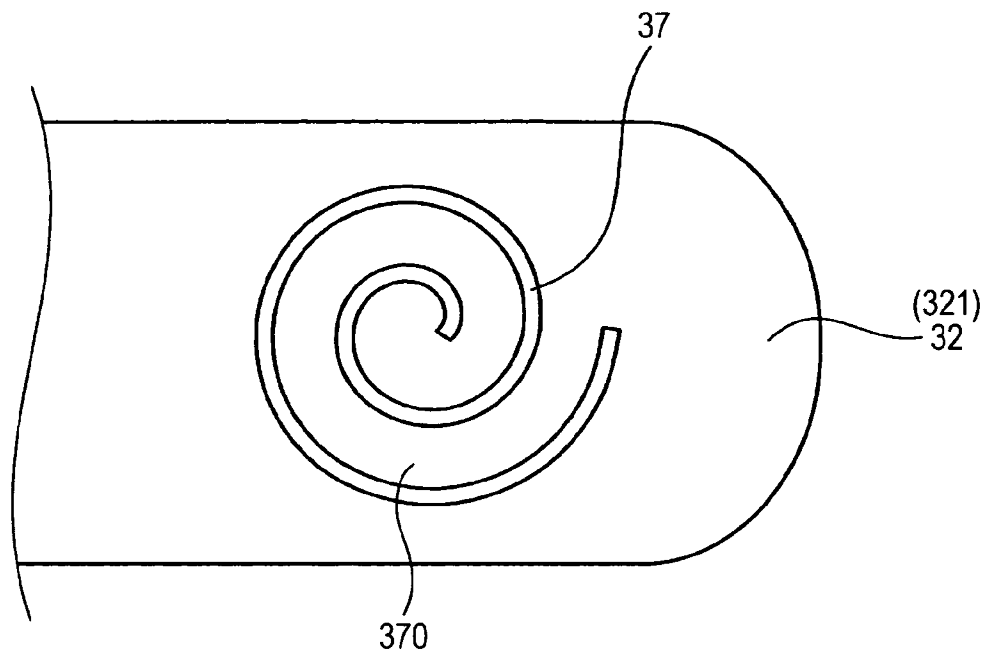
FIG. 21 is a partially enlarged view which illustrates a structure of a first section of a voltage measuring terminal in the seventh embodiment.
Figure 22:
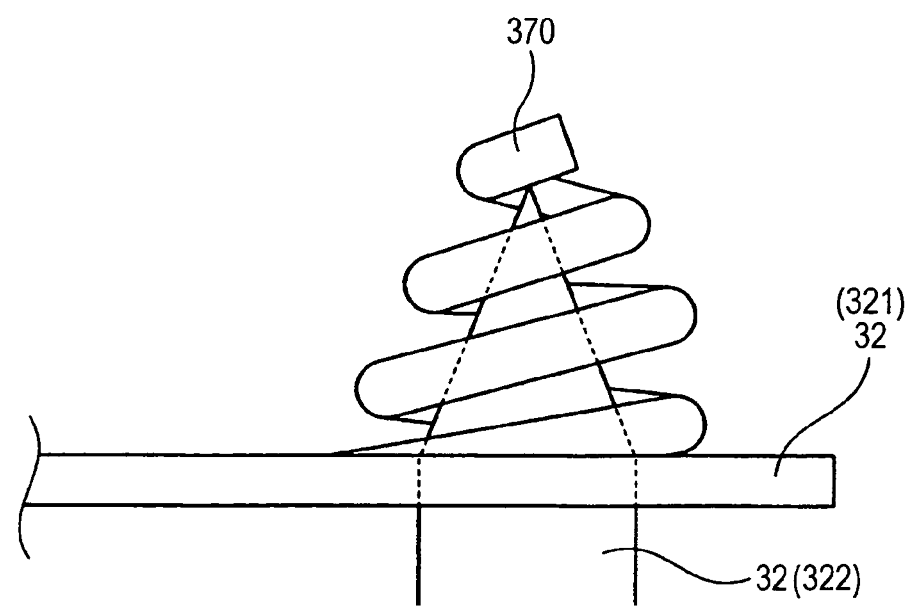
FIG. 22 is a partially enlarged view which illustrates a joint of the first section and a second section of the voltage measuring terminal of FIG. 21.

The power converter 1 of the seventh embodiment will be described below with reference to FIGS. 21 and 22 which is different in configuration of the voltage measuring terminals 32 from the sixth embodiment.

Specifically, the first section 321 of the voltage measuring terminal 32 has formed therein the cut-out hole 37 in which the end of the second section 322 is fit to establish electrical connection between the first section 321 and the second section 322. The cut-out hole 37 is, as can be seen in FIG. 21, implemented by a spiral groove or slit to form a scroll spring 370. The second section 322 has a cone-shaped end, as illustrated in FIG. 22, which is to be thrust against the scroll spring 370 to establish the electrical connection of the first and second sections 321 and 322.

Other arrangements are identical with those in the first embodiment, and explanation thereof in detail will be omitted here.

The power converter 1 of the eighth embodiment will be described below with reference to FIGS. 23 and 24 which is different in structure of the voltage measuring terminals 32 from the sixth embodiment.

The first section 321 of the voltage measuring terminal 32 has formed therein the cut-out hole 37 in which the end of the second section 322 is fit to establish electrical connection between the first section 321 and the second section 322.

Figure 23:
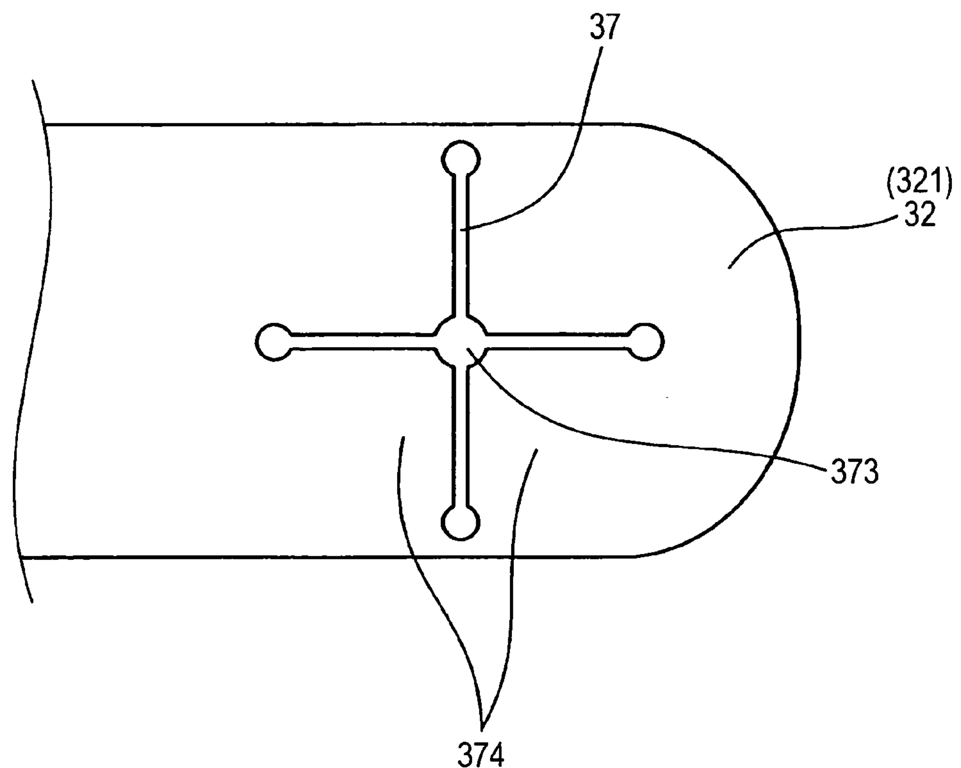
FIG. 23 is a partially enlarged view which illustrates a structure of a first section of a voltage measuring terminal in the eighth embodiment.
Figure 24:
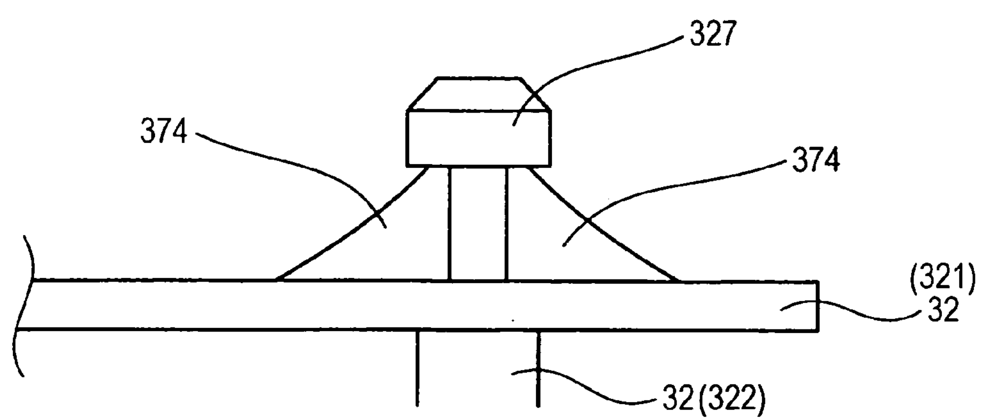
FIG. 24 is a partially enlarged view which illustrates a joint of the first section and a second section of the voltage measuring terminal of FIG. 23.

The cut-out hole 37 is, as can be seen in FIG. 23, implemented by a cross-shaped groove or slit extending from a center circular hole 373 to form four triangular shaped elastic springs 374. The second section 322 has, like in the sixth embodiment, formed on the end thereof the flange head 327 which is greater in diameter than the center circular hole 373 of the first section 321. The mechanical/electrical joint between the first and second sections 321 and 322 is achieved by pushing the flange head 327 against the center hole 373 of the first section 321 while elastically thrusting the spring 374 until the springs 374 are snap fit on the jaw of the flange head 327 of the second section 322.

Other arrangements are identical with those in the first embodiment, and explanation thereof in detail will be omitted here.

Figure 25:
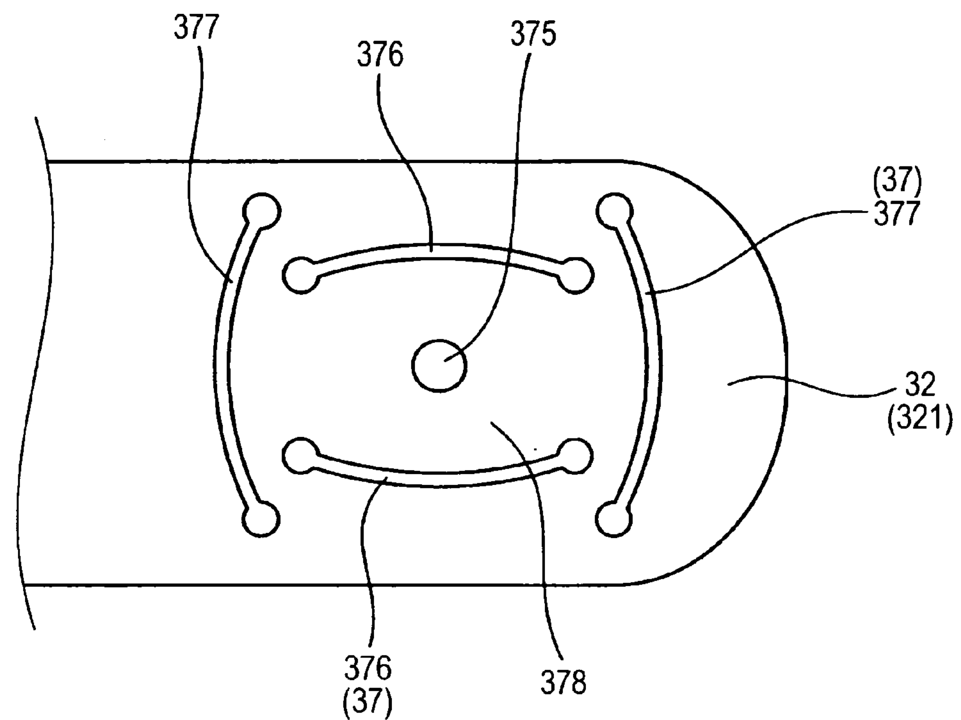
FIG. 25 is a partially enlarged view which illustrates a structure of a first section of a voltage measuring terminal in the ninth embodiment.
Figure 26:
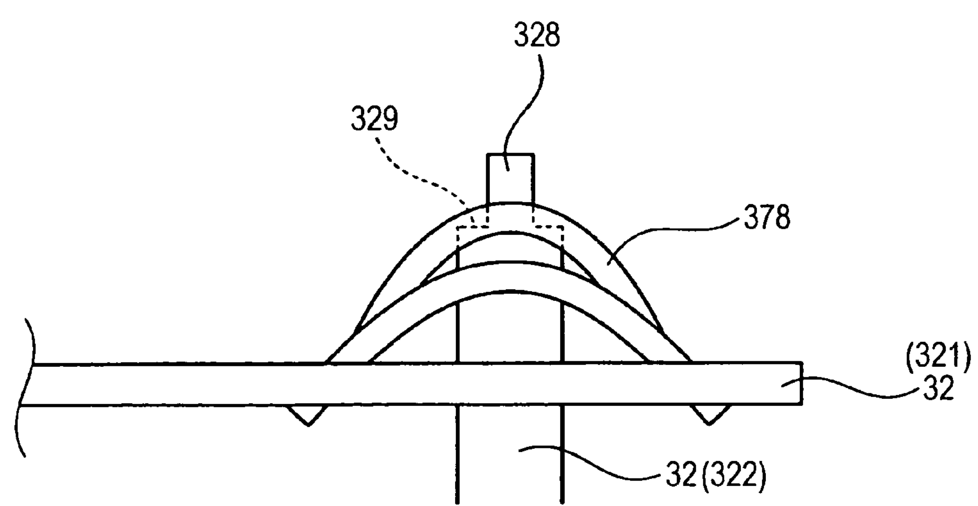
FIG. 26 is a partially enlarged view which illustrates a joint of the first section and a second section of the voltage measuring terminal of FIG. 25.
Figure 27:
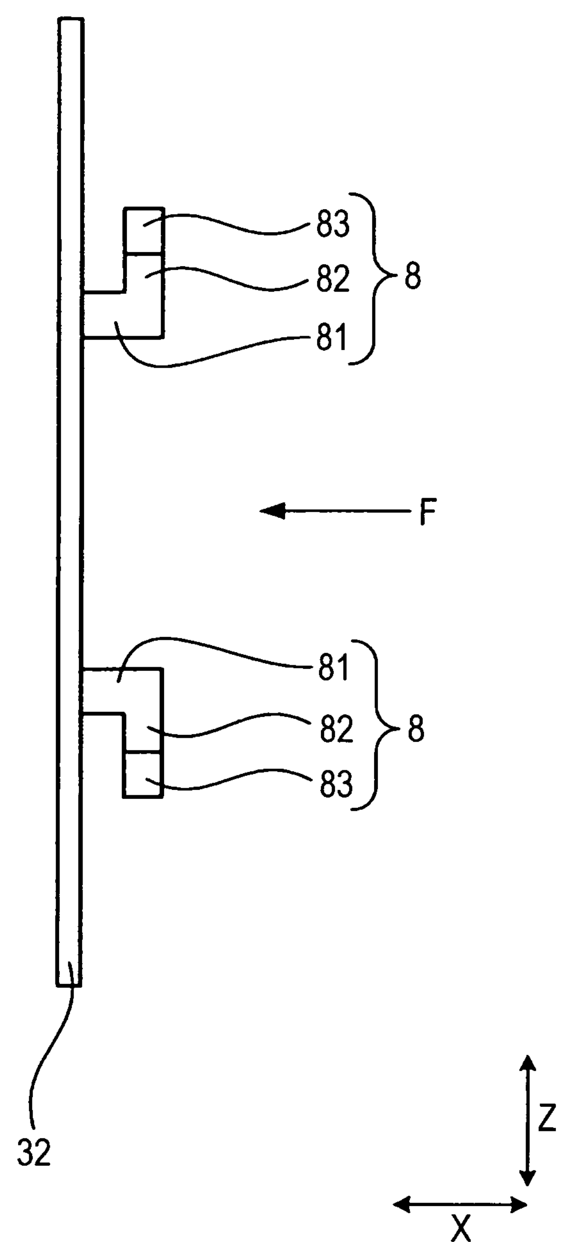
FIG. 27 is a side view which illustrates a voltage measuring terminal in the tenth embodiment.
Figure 28:
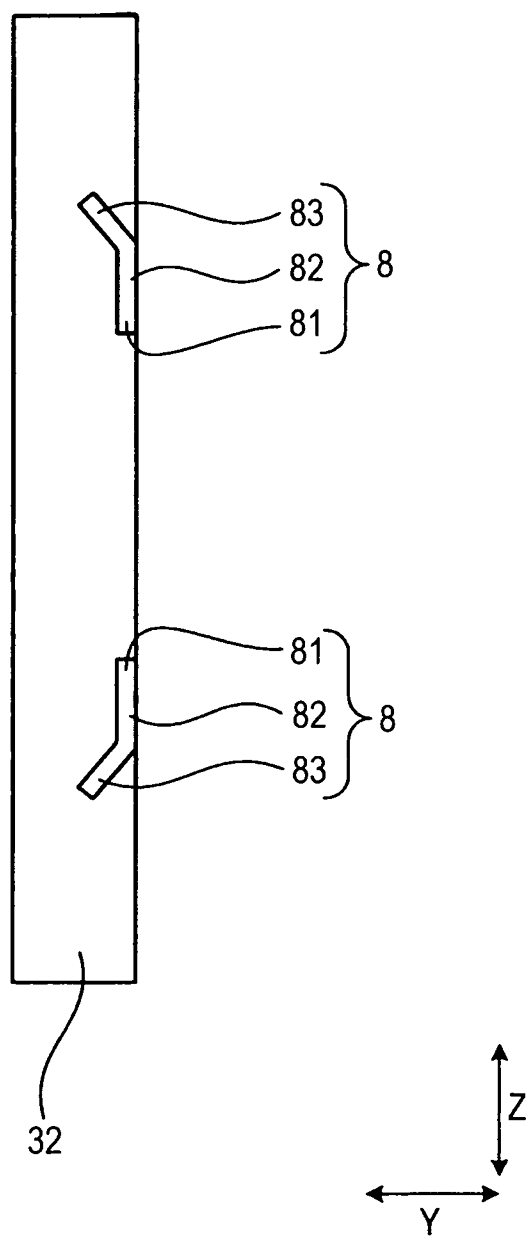
FIG. 28 is an illustration as viewed from an arrow F in FIG. 27.

The power converter 1 of the ninth embodiment will be described below with reference to FIGS. 25 and 26 which is different in structure of the voltage measuring terminals 32 from the sixth embodiment.

The first section 321 of the voltage measuring terminal 32 has a center hole 375, a pair of inner arc-shaped slits 376, and a pair of outer arc-shaped slits 377 formed therein. The inner arc-shaped slits 376 extend substantially parallel to the length of the first section 321 and are symmetric with respect to the center hole 375. Similarly, the outer arc-shaped slits 377 extend substantially parallel to the width of the first section 321 and are symmetric with respect to the center hole 375. The outer arc-shaped slits 377 are located outside the inner arc-shaped slits 376 in the lengthwise direction of the first section 321. The inner and outer arc-shaped slits 376 and 377 form a flat spring 378 around the center hole 375.

The second section 322 has a small-diameter portion 328 extending from the end of a major portion thereof. The electrical joint between the first and second sections 321 and 322 is achieved by inserting the small-diameter portion 328 into the center hole 375 and then pushing the second section 322 while elastically thrusting the flat spring 378 until the flat spring 378 are in direct abutment with a shoulder 328 (i.e., an annular end surface of the major portion of the second section 322).

Other arrangements are identical with those in the first embodiment, and explanation thereof in detail will be omitted here.

The power converter 1 of the tenth embodiment will be described below with reference to FIGS. 27 to 30 which is different in structure of the voltage measuring terminals 32 from the first embodiment.

Each of the voltage measuring terminals 32 is equipped with two terminal hooks 8 for use in retaining the voltage measuring terminal 32 on the casing 31. Each of the terminal hooks 8 functions as a male hook and is made up of three parts: a first protrusion 81 extending from the body of the voltage measuring terminal 32 in the X-direction, a second protrusion 82 extending from an end of the first protrusion 81 in the Z-direction, and a third protrusion 83 extending diagonally from the second protrusion 82 parallel to the body of the voltage measuring terminal 32. The first, second, and third protrusions 81, 82, and 83 will also be referred to below as a first upright stud, a horizontal lug, and a diagonal lug, respectively.

Figure 29:
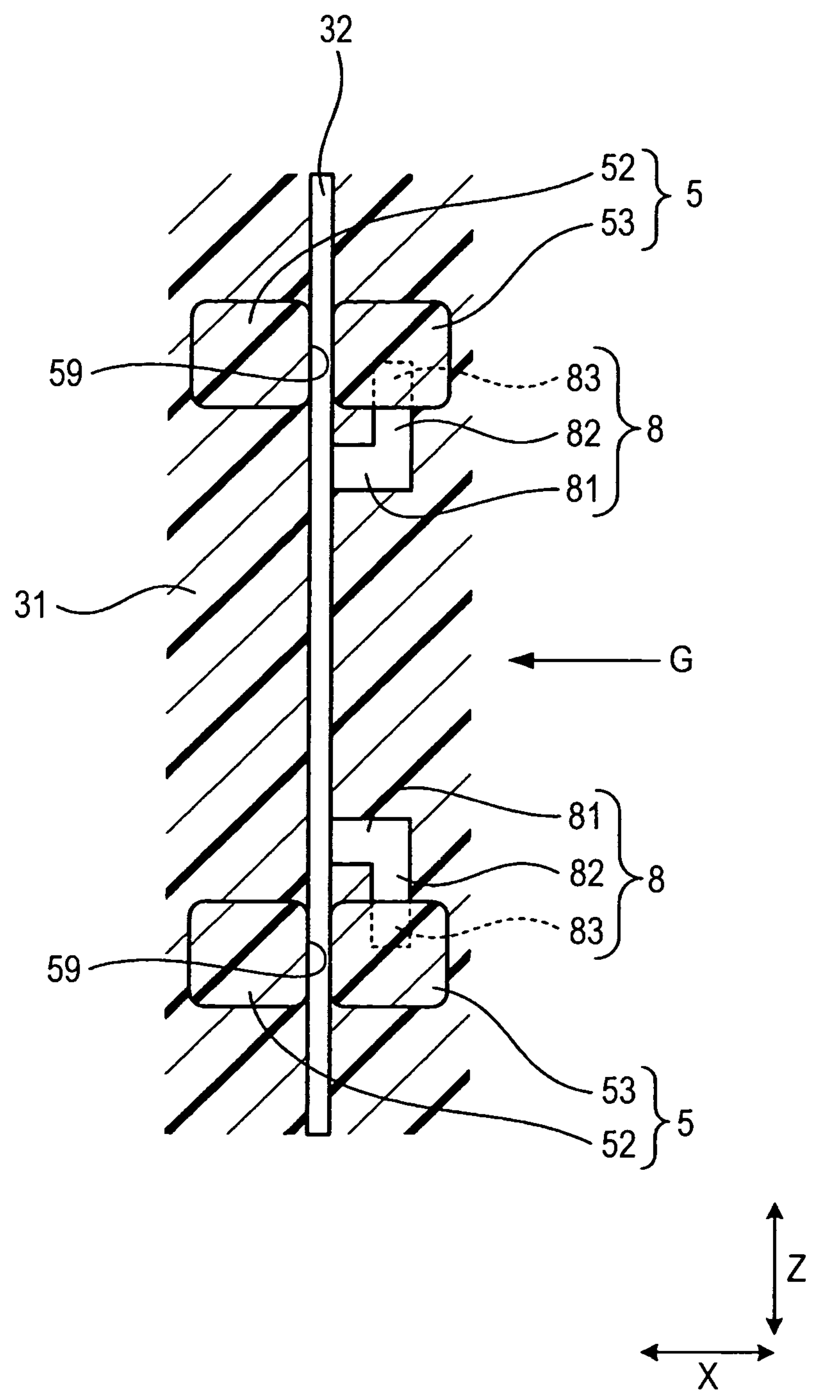
FIG. 29 is a plan view which illustrates a voltage measuring terminal retained in a casing of a capacitor in the tenth embodiment.
Figure 30:
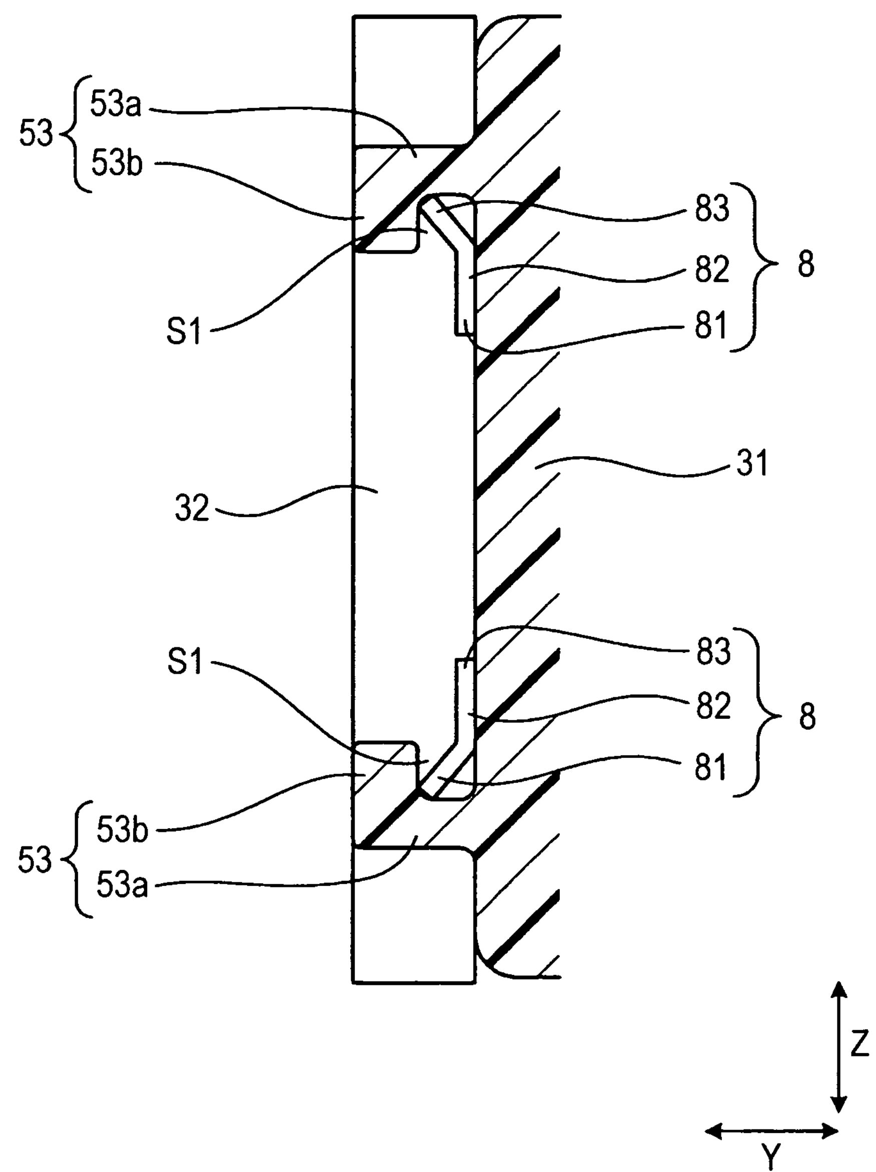
FIG. 30 is an illustration as viewed from an arrow G in FIG. 29.

The casing 31 of the capacitor 3, as clearly illustrated in FIGS. 29 and 30, has two terminal holders 5 formed therein. Each of the terminal holders 5 is made up of a pair of female hooks 52 and 53. The female hook 53 is, as clearly illustrated in FIG. 30, made up of two parts: a first protrusion 53*a* extending from the body of the casing 31 in the Y-direction and a second protrusion 53*b* extending from an end of the first protrusion 53*a* in the Z-direction. The first and second protrusions 53*a* and 53*b* will also be referred to below as an upright stud and a horizontal lug, respectively. The upright stud 53*a*, the horizontal stud 53*b*, and the outer wall of the casing 31 define a groove or recess S1 into which the diagonal lug 83 of the voltage measuring terminal 32 is fit. The fitting of the diagonal lug 83 into the recess S1 is achieved by inserting the voltage measuring terminal 32 into grooves between the female hooks 52 and 53 of the terminal holders 5 in a direction perpendicular to the surface of the casing 31 while allowing the diagonal lugs 83 to be deformed elastically and snapping the diagonal lugs 83 into the recesses S1, respectively. This establishes the mechanical joint of the voltage measuring terminal 32 to the casing 31.

The voltage measuring terminal 32 is held by the female hooks 52 and 53 of each of the terminal holders 5 from being moved in the X-direction (i.e., the width-wise direction of the voltage measuring terminal 32). The diagonal lugs 83 of the terminal hooks 8 are locked firmly in the recesses S1 of the female hooks 53 from being moved in the Z-direction (i.e., the lengthwise direction of the voltage measuring terminal 32). The movement of the voltage measuring terminal 32 in the Y-direction is stopped by the abutment of the diagonal lugs 83 of the terminal hooks 8 with the horizontal studs 53*b* of the female hooks 53.

Other arrangements are identical with those in the first embodiment, and explanation thereof in detail will be omitted here.

The movements of the voltage measuring terminal 32 in three directions: the X-, Y-, and Z-directions are locked by the snap-fit features (i.e., the combinations of the terminal holders 5 and the terminal hooks 8), thus ensuring the stability of the joint of the voltage measuring terminal 32 to the casing 32 and the orientation thereof, thereby facilitating the ease with which the voltage measuring terminal 32 is coupled to the control circuit board 4.

The power converter 1 of the tenth embodiment also offers the same other advantages as in the first embodiment.

The power converter 1 of the eleventh embodiment will be described below with reference to FIGS. 31 to 34 which is different in location where the second section 322 of each of the voltage measuring terminals 32 is joined to the control circuit board 4 from the first embodiment. The same reference numbers, as employed in the first embodiment, will refer to the same parts, and explanation thereof in detail will be omitted here.

Specifically, the joint of the first section 321 and the second section 322 of each of the voltage measuring terminals 32 is, as can be seen in FIGS. 31 to 34, located away from that of the second section 322 and the voltage detector 42, as viewed from the Z-direction (i.e., direction normal to the major surface 48 of the control circuit board 4).

Figure 33:
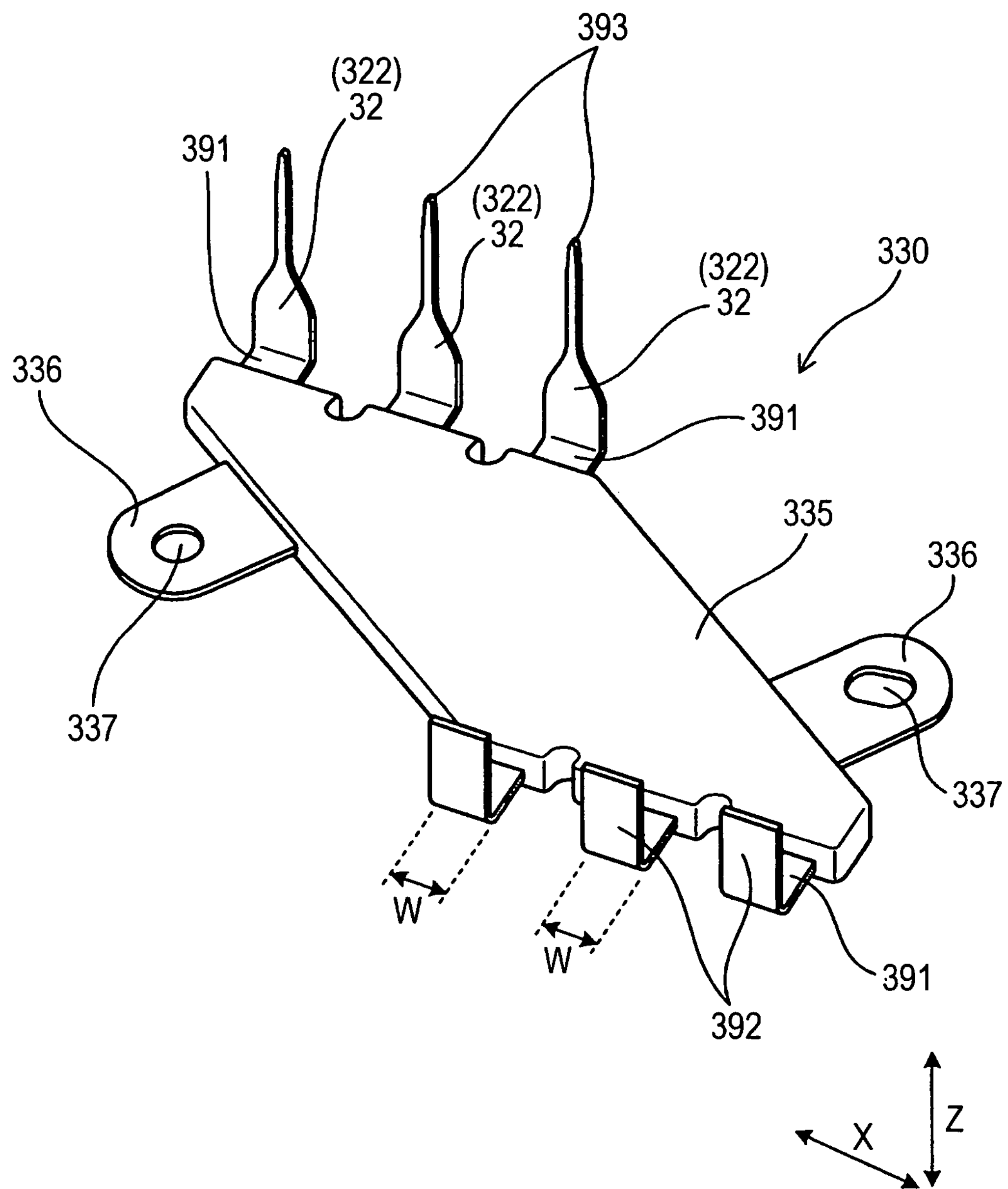
FIG. 33 is a perspective view which illustrates a terminal module in the eleventh embodiment.
Figure 34:
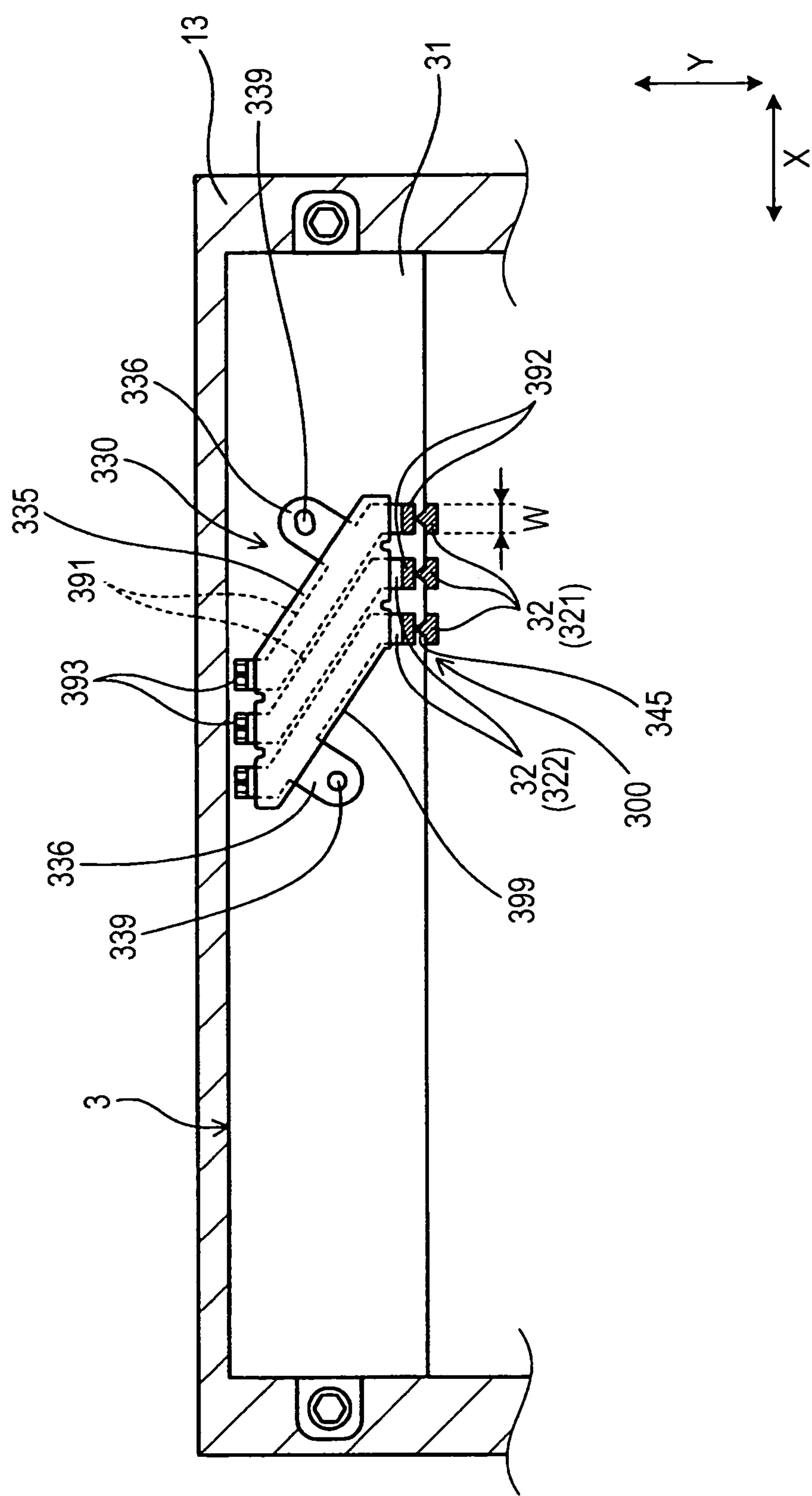
FIG. 34 is a sectional view as taken along the line H-H in FIG. 32.

The power converter 1 is, as illustrated in FIGS. 33 and 34, equipped with the three voltage measuring terminals 32. The second section 322 of each of the voltage measuring terminals 32 is made of a metallic strip whose surface is metal-plated (e.g., solder-plated). The first section 321 is not metal-plated. The second sections 322 of all the voltage measuring terminals 32 are encapsulated by a resinous mold 335 as a terminal module 330. The terminal module 330 is secured to the surface of the casing 31 of the capacitor 3.

Figure 31:
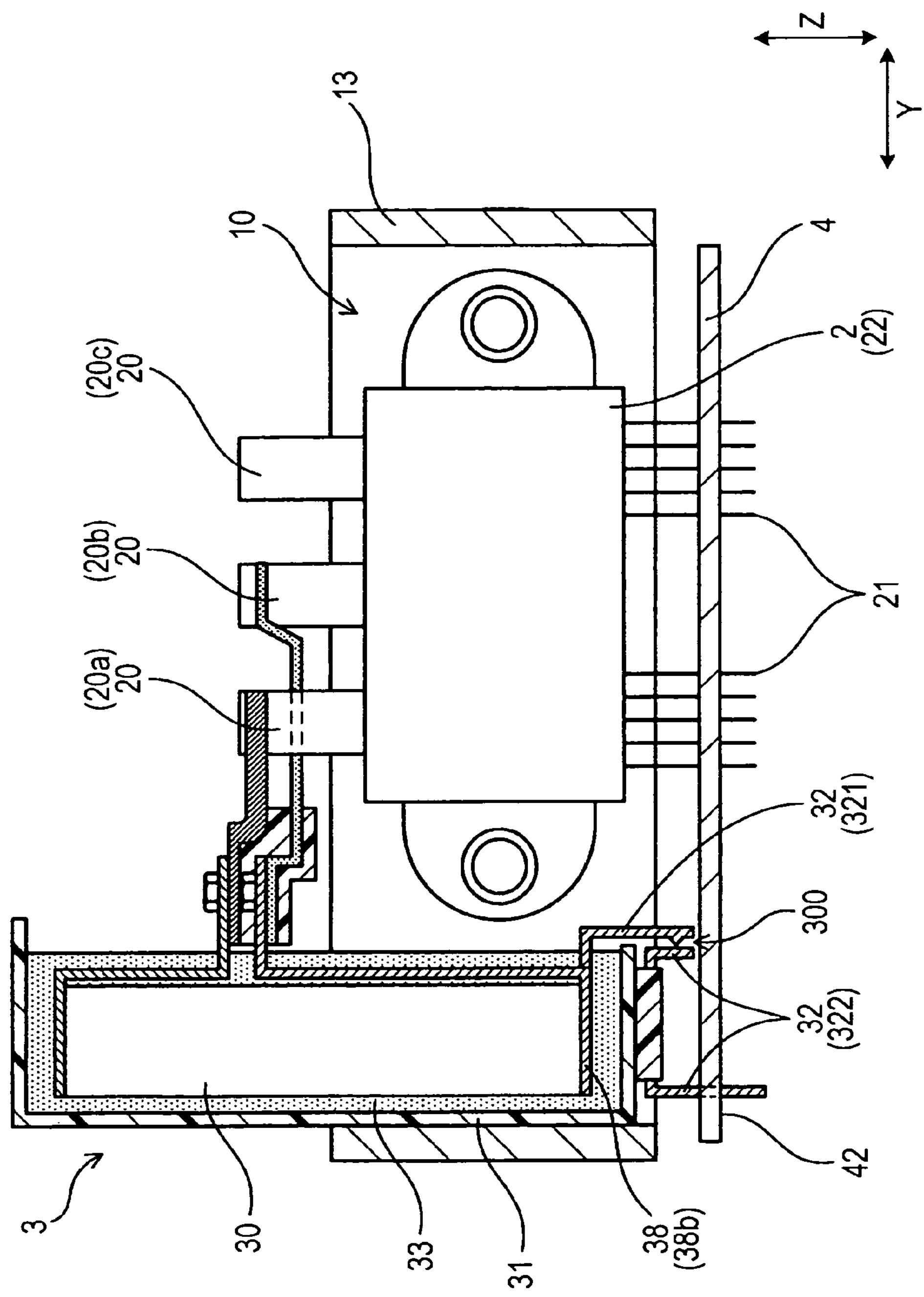
FIG. 31 is a sectional view which illustrates a power converter in the eleventh embodiment.

The resinous mold 335 is of a substantially parallelogram as viewed from the Z-direction. The second section 322 is of a substantially C-shape and made up of three parts: a terminal-joining portion 392, a board-joining portion 393, and a connecting portion 391 which connects the terminal-joining portion 392 and the board-joining portion 393 together. The connecting portion 391 is partly encapsulated by the resinous mold 335. The terminal-joining portion 392 and the board-joining portion 393 extend, as illustrated in FIG. 31, from ends of the connecting portion 391 parallel to each other toward the control circuit board 4 in the Z-direction.

Figure 32:
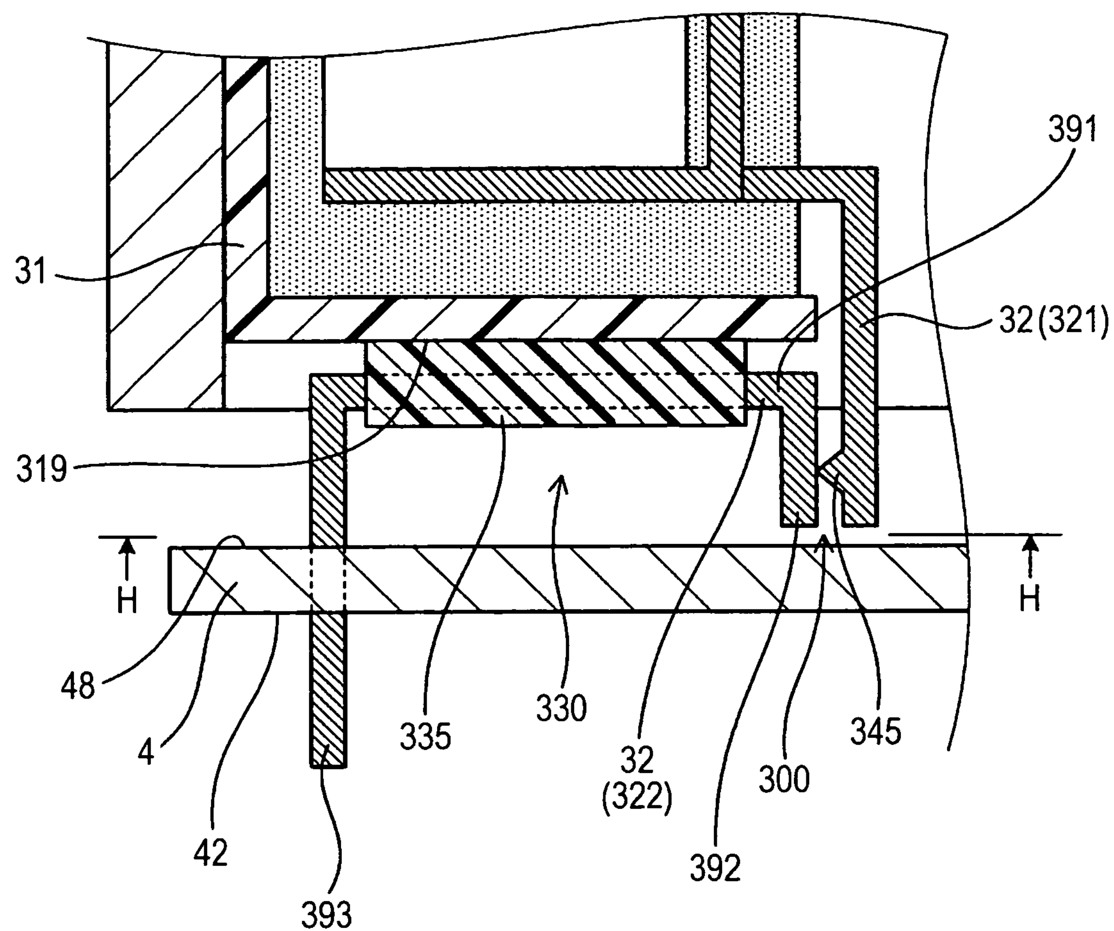
FIG. 32 is a partially enlarged view of FIG. 31.

The second section 322 is so oriented, as can be seen in FIG. 32, as to have the connecting portion 391 extending parallel to the major surface 48 of the control circuit board 4. The connecting portion 391 is, as described above, disposed inside the resinous mold 335 working as a sealed capsule. The resinous mold 335 is fixed on the surface 319 of the casing 31 which faces the major surface 48 of the control circuit board 4.

The first section 321 of each of the voltage measuring terminals 32, as illustrated in FIGS. 32 and 34, has a protrusion 345 formed on the surface thereof facing the terminal-joining portion 392 of the second section 322. The protrusion 345 has a tip which is placed in contact with and resistance-welded to the surface of the terminal-joining portion 392 to make a mechanical/electrical joint of the first and second sections 321 and 322.

Figure 38:
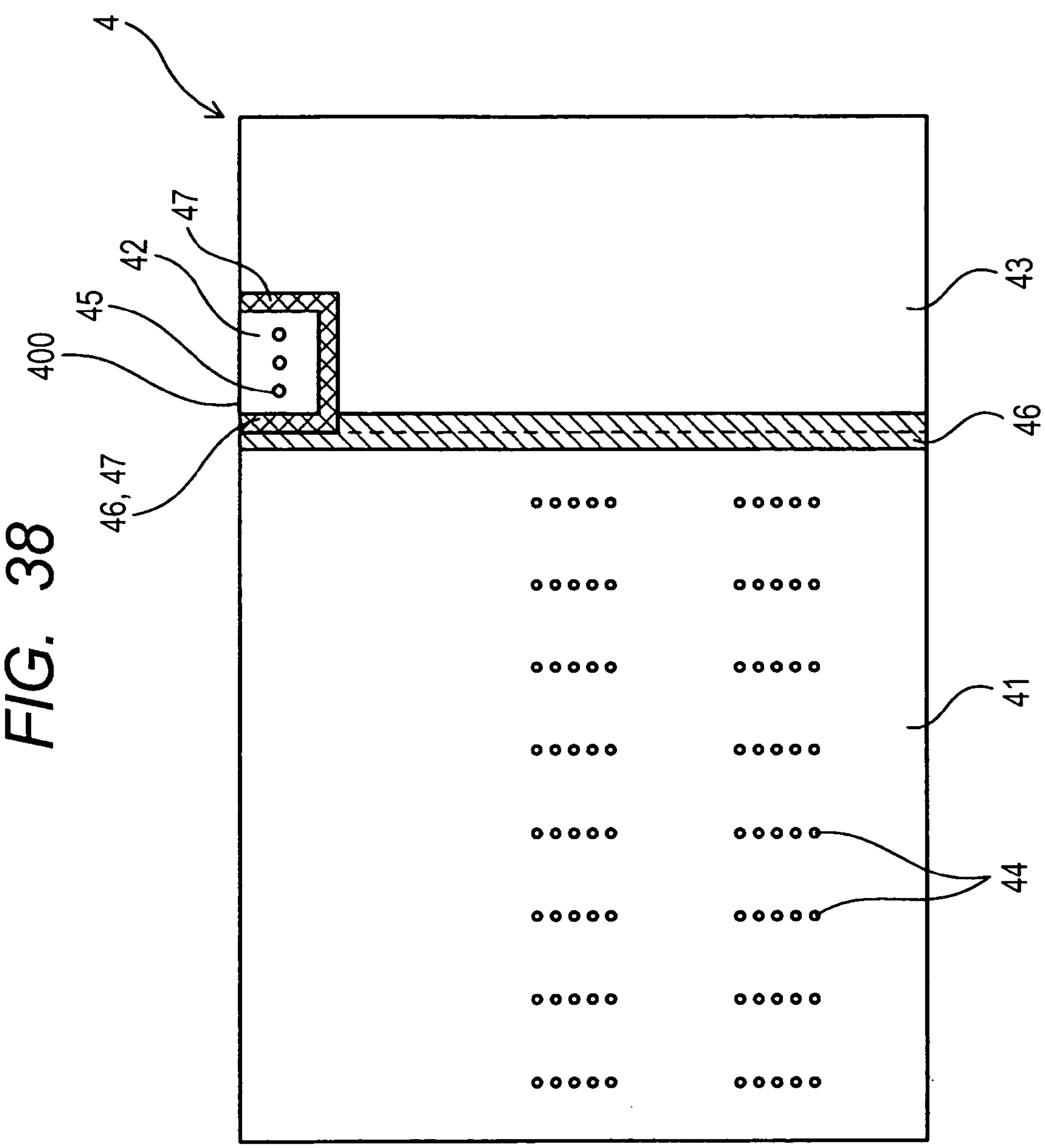
FIG. 38 is a plan view which illustrates a control circuit board in the eleventh embodiment.

The terminal-joining portion 392, as clearly illustrated in FIG. 33, has a width W extending in the X-direction. The width W is greater than that of a pin-like top portion of the board joining portion 393. The top portion of the board-joining portion 393 is fit in a corresponding one of the holes 45 which are, as illustrated in FIG. 38, formed in the control circuit board 4. The width W of the terminal-joining portion 392 is determined to be greater than a tolerance for misalignment of the first section 321 in the X-direction.

The connecting portion 391 of the second section 322 of each of the voltage measuring terminals 32 extends, as clearly illustrated in FIG. 34, parallel to the side surface 399 of the resinous mold 336 which extends diagonally with respect to the length of the casing 31 of the capacitor 3. Outer two of the second sections 322 have module-mounting tabs 336 which extend outside the resinous mold 335. The module-mounting tabs 336 have holes 337 for mounting the terminal module 330 on the casing 3.

Figure 35:
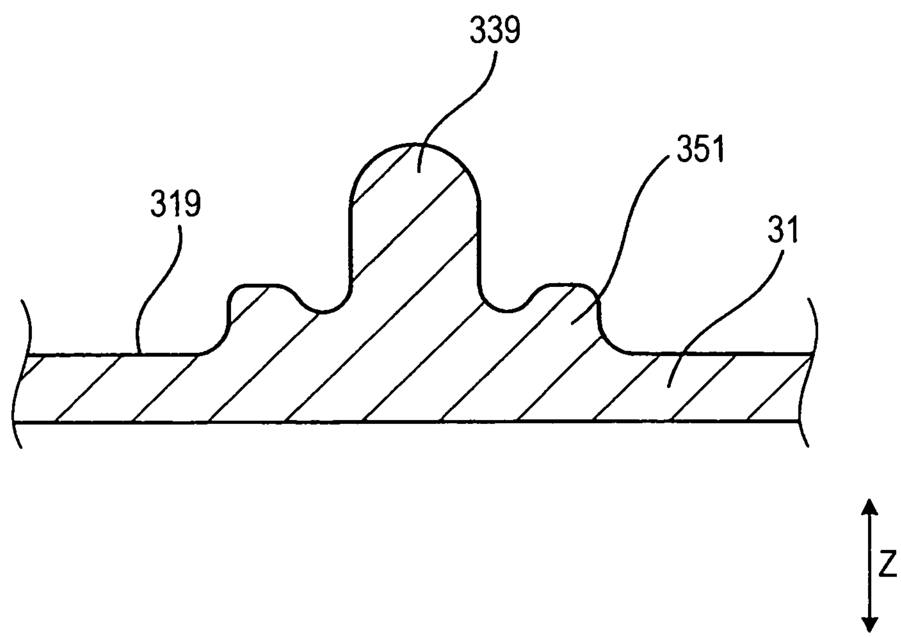
FIG. 35 is partially sectional view which illustrates a thermoplastic staking structure of a terminal module of the eleventh embodiment.

The mounting of the terminal module 330 on the casing 31 will be described below in detail. Specifically, the terminal module 330 is secured to the casing 31 using thermoplastic staking techniques (also called heat staking or thermal caulking). The casing 31, as illustrated in FIG. 35, includes mount tables 351 (only one is shown for the brevity of illustration) and studs 339 protruding from the mount tables 351 in the Z-direction. Each of the mount table 351 is formed on the surface 319 of the casing 31 which is, as illustrated in FIG. 32, farther away from the control circuit board 4. The casing 31 is made of a thermoplastic resin.

Figure 36:
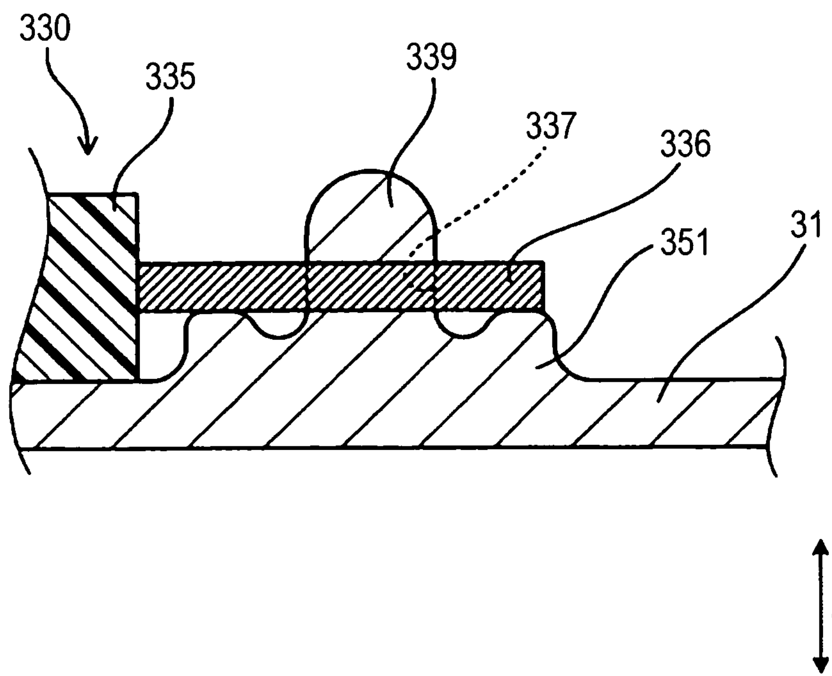
FIG. 36 is a partially sectional view which illustrates how to thermoplastic-stake a casing of a capacitor to establish a joint with the terminal module of FIG. 35.
Figure 37:
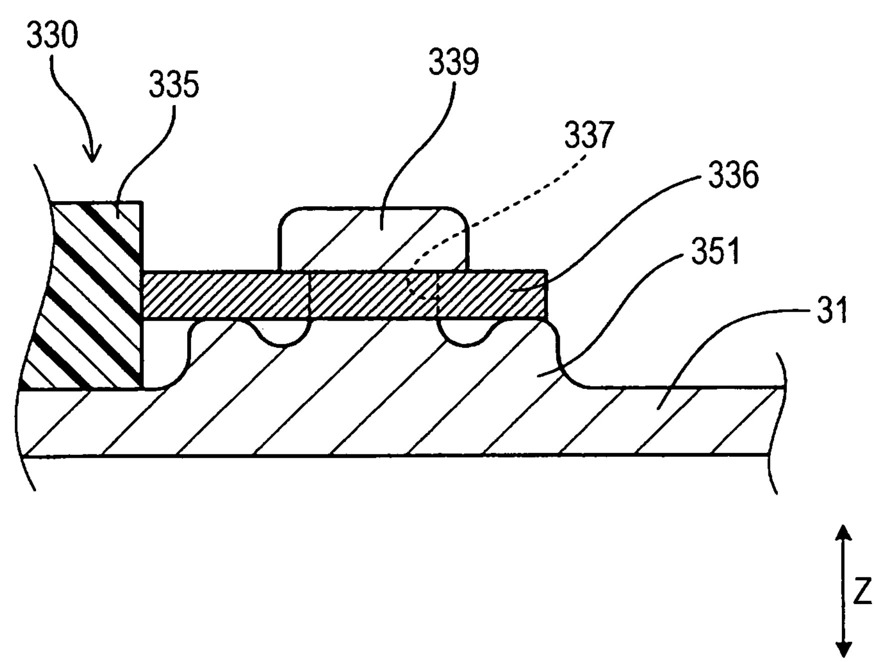
FIG. 37 is a partially sectional view which illustrates a casing of a capacitor staked to the terminal module of FIG. 35.

The joining of the terminal module 330 to the casing 31 is achieved, as illustrated in FIG. 36, by placing the terminal module 330 on the casing 31, inserting the studs 339 into the holes 337 of the module-mounting tabs 336, pressing heated compression probes (not shown) on the tops of the studs 339 while softening them to form large-diameter heads on the studs 339, as illustrated in FIG. 37. The head of each of the studs 339 and the mount table form a grip in the Z-direction in which the module mounting tab 336 is retained.

Like in the first embodiment, the control circuit board 4, as illustrated in FIG. 38, has the high-voltage region 40, the low-voltage region 41, and the insulating region 46 to electrically insulate the high-voltage region 40 and the low-voltage region 41 from each other. The voltage detector 42 is disposed on an area of the control circuit board 4 which extends from the side edge 400 to the insulating region 46.

Other arrangements are identical with those in the first embodiment, and explanation thereof in detail will be omitted here.

The structure of the power converter 1 of the eleventh embodiment has beneficial advantages, as discussed below.

The joint 300 of the first section 321 and the second section 322 of each of the voltage measuring terminals 32 is, as can be seen in FIGS. 31 and 34, separate from the joint of the second section 322 to the control circuit board 42 in the Y-direction. In other words, a portion of the first section 321 of the voltage measuring terminal 32 extending outside the capacitor 3 is located away from the voltage detector 42, thereby resulting in an increase in freedom of arrangement of the voltage detector 42 on the surface of the control circuit board 4.

The second sections 322 of all the voltage measuring terminals 32 are, as illustrated in FIG. 33, disposed inside the sealed capsule 335 as the terminal module 330. This facilitates the ease with which the first and second sections 321 and 322 are aligned with each other and joined together.

The terminal module 330 in which the second sections 322 are disposed is mounted on the casing 31 through the thermoplastic staking techniques. This eliminates the need for fasteners such as bolts or nuts to secure the terminal module 330 to the casing 31, thus resulting in a decrease in production cost of the power converter 1.

The surface of the second section 322 of each of the voltage measuring terminals 32 is plated or coated with the metal layer (e.g., the solder layer), thus facilitating the joining of the second section 322 to the control circuit board 4. Specifically, when the second section 322 is soldered to the control circuit board 4, the metal layer on the second section 322 enhances the solder wettability on the surface of the second section 322.

If each of the voltage measuring terminals 32 is made of a one-piece member, it is necessary to form the metal layer over the entire surface of the voltage measuring terminal 32. In contrast, the voltage measuring terminal 32 is made up of two parts: the first section 321 and the second section 322, thus permitting an area of the voltage measuring terminal 32 which is to be coated with the metal layer to be minimized. This also results in a decrease in production cost of the voltage measuring terminals 32.

The first section 321 of each of the voltage measuring terminals 32, as already described in FIG. 34, has the protrusion 345 formed on the surface thereof. The first section 321 and the second section 322 are welded together at the tip of the protrusion 345. The welding of the first and second sections 321 and 322 may be achieved by pressing the tip of the protrusion 345 against the surface of the second section 322 (i.e., the terminal-joining portion 392), in other words, established at a small contact area between the first and second sections 321 and 322, thus resulting in a decreased amount of thermal energy, as generated by the resistance welding, which facilitates the ease of welding operation.

The width W of the terminal-joining portion 392 of each of the voltage measuring terminals 32 is selected to be greater than the tolerance for misalignment of the first section 321 in the X-direction, thereby ensuring the stability in contact, that is, welding between the first and second sections 321 and 322 at the protrusion 345 even when the first section 321 is misaligned in the X-direction.

Particularly, the structure of the power converter 1 of this embodiment is, as clearly illustrated in FIG. 31, designed not to position the capacitor devices 30 within the casing 31, but only to arrange them hermetically within the resinous capsule 33, thus causing the capacitor devices 30 to be misaligned greatly, which will lead to great misalignment of the first sections 321 of the voltage measuring terminals 32. The width W of the second sections 322 absorbs such a misalignment.

The voltage detector 42 is, as illustrated in FIG. 38, disposed on the area of the control circuit board 4 which is located in abutment with the side edge 400 and the insulating region 46, thereby permitting, like in the first embodiment, the insulating region 46 and the detector insulating region 47 to be laid to overlap each other to have a common area or a portion of the detector insulating region 47 to be omitted. This minimizes an area of the control circuit board 4 occupied only by the detector insulating region 47, which results in an increased area of the control circuit board 4 available for installation of electronic parts.

As apparent from the above discussion, the structure of the power converter 1 of this embodiment enables the voltage detector 42 to be disposed within the low voltage region 43 regardless of the locations of the first portions 321 of the voltage measuring terminals 32 (i.e., the joint 300 of the first section 321 and the second section 322 in FIG. 31) which extend outside the capacitor 3.

The power converter 1 of the eleventh embodiment also offers the same other advantages as in the first embodiment.

Figure 39:
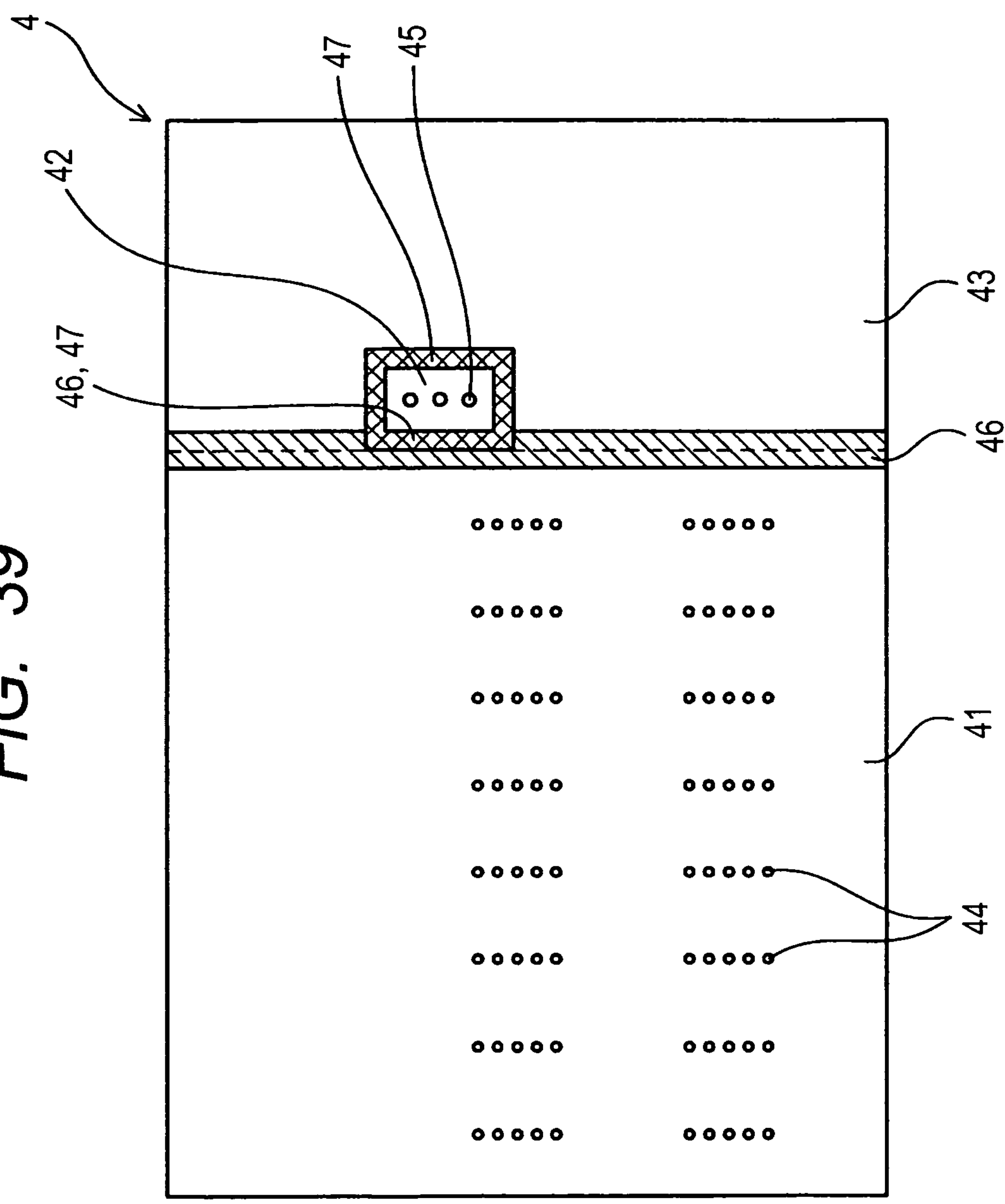
FIG. 39 is a plan view which illustrates a modification of the control circuit board in the eleventh embodiment.

The voltage detector 42, as illustrated in FIG. 39, may alternatively be disposed on an area of the control circuit board 4 which is located in abutment with only the insulating region 46. The insulating region 46 is laid to overlap the detector insulating region 47 partially, thus resulting in a decrease in area of the control circuit board 4 occupied only by the detector insulating region 47, which results in an increased area of the control circuit board 4 available for installation of electronic parts.

Figure 40:
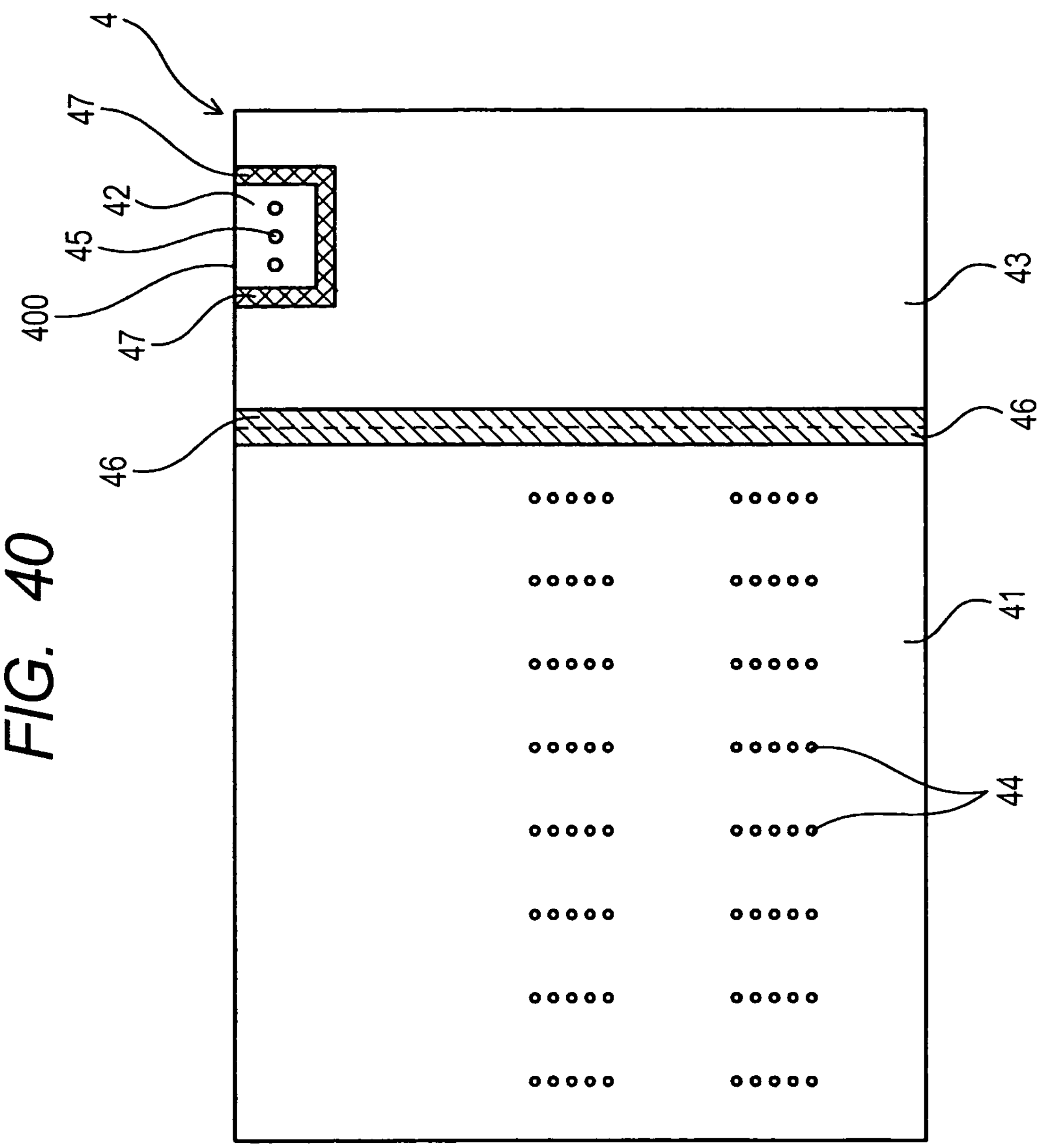
FIG. 40 is a plan view which illustrates the second modification of the control circuit board in the eleventh embodiment.

The voltage detector 42, as illustrated in FIG. 40, may alternatively be disposed on an area of the control circuit board 4 which is located in abutment with only the side edge 400 of the control circuit board 4. This also permits the part of the detector insulating region 47 to be omitted, like in the above embodiments, thus resulting in an increased area of the control circuit board 4 available for installation of electronic parts.

Figure 41:
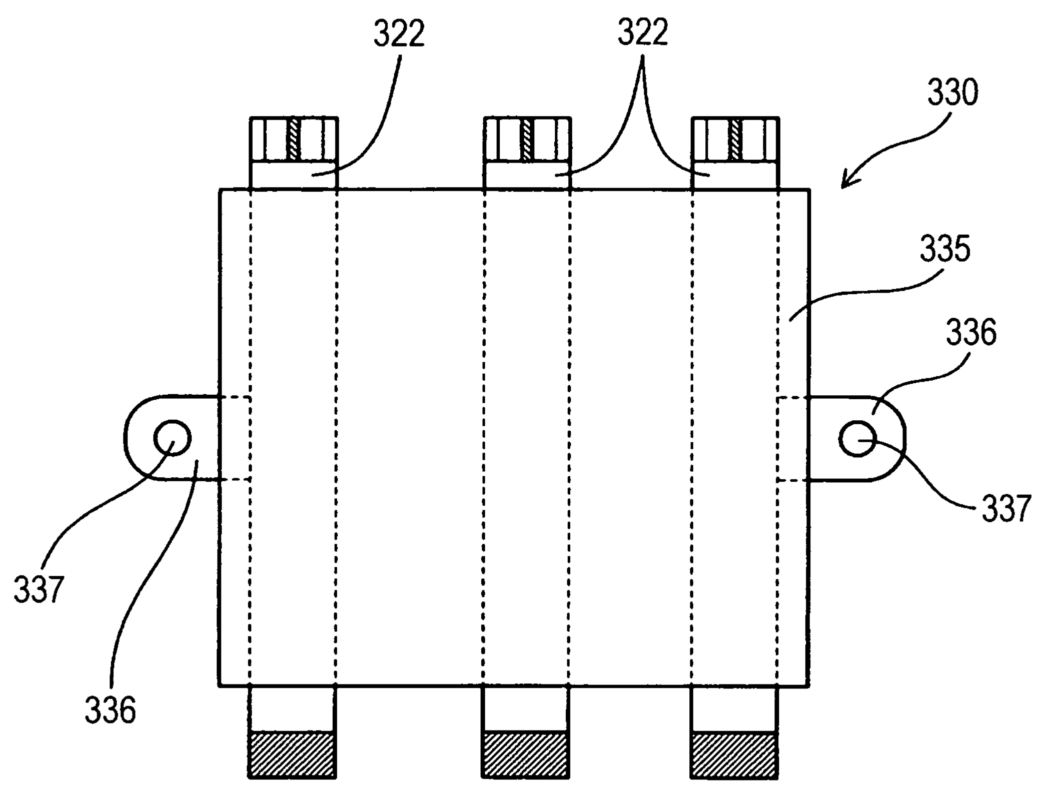
FIG. 41 is a plan view which illustrates the third modification of the control circuit board in the eleventh embodiment.

The sealed capsule 335 of the terminal module 330 is, as can be seen in FIG. 33, substantially a parallelogram as viewed from the Z-direction, but may be, as illustrated in FIG. 41, of a rectangular shape.

The terminal-joining portion 392 of the second section 322 of each of the voltage measuring terminals 32 may alternatively be shaped to have a protrusion such as the protrusion 345. The protrusion 345 on the first section 321 may be omitted.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A power converter comprising:

a control circuit board;

a plurality of semiconductor modules each of which includes a main unit in which semiconductor devices are fabricated, the main unit having power terminals and control terminals extending therefrom;

a capacitor working to smooth voltage to be applied to the semiconductor modules, the capacitor including capacitor devices coupled to the power terminals and voltage measuring terminals coupled to electrodes of the capacitor devices;

a control circuit disposed on the control circuit board to control switching operations of the semiconductor modules; and a voltage detector disposed on the control circuit board to measure voltages applied to the capacitor devices, wherein the control terminals extend in a direction normal to a surface of the control circuit board in connection with the control circuit, and wherein the voltage measuring terminals extend in a direction normal to the surface of the control circuit board in connection with the voltage detector.

2. A power converter as set forth in claim 1, wherein all of the voltage measuring terminals are laid to overlap the control circuit board, as viewed from the direction normal to the surface of the control circuit board.

3. A power converter as set forth in claim 1, wherein the capacitor and the semiconductor modules are arrayed adjacent each other in a direction parallel to a major surface of the control circuit board.

4. A power converter as set forth in claim 1, wherein each of the voltage measuring terminals is made up of a first section joined to one of the capacitor devices and a second section made to be separate from the first section, the second section being secured to the first section and coupled with the voltage detector.

5. A power converter as set forth in claim 4, wherein the second section has a portion extending parallel to the major surface of the control circuit board, and wherein a joint of the second section to the first section is located away from a joint of the second section to the voltage detector, as viewed from the direction normal to the major surface of the control circuit board.

6. A power converter as set forth in claim 4, further comprising a terminal module in which the second sections of all of the voltage measuring terminals are disposed inside a sealed capsule.

7. A power converter as set forth in claim 4, wherein one of the first and second sections has a protrusion at which the first and second sections are welded, and wherein the second section has a width which is greater than a tolerance for misalignment of the first section in a width-wise direction of the second section.

8. A power converter as set forth in claim 1, wherein the capacitor includes a casing in which the capacitor devices are disposed and has an opening through which the capacitor devices are to be installed, the capacitor being retained with the opening facing the semiconductor modules.

9. A power converter as set forth in claim 1, wherein the capacitor includes a casing in which the capacitor devices are disposed and which has positioning grooves in which the voltage measuring terminals are fit.

10. A power converter as set forth in claim 9, wherein each of the positioning grooves has formed on an inner wall thereof a pair of protrusions which create a grip through which a corresponding one of the voltage measuring terminals extends.

11. A power converter as set forth in claim 1, wherein the control circuit board includes a high-voltage region to which voltage to be developed at the power terminals is applied and a low-voltage region to which the voltage lower than the voltage to be developed at the power terminals is applied, and wherein the voltage detector is disposed on a peripheral area of the low-voltage region.

12. A power converter as set forth in claim 11, wherein the control circuit board has an insulating region which delimits and electrically insulates between the high-voltage region and the low-voltage region, and wherein the voltage detector is disposed in abutment with a side edge of the control circuit board and the insulating region.

13. A power converter as set forth in claim 12, wherein a portion of the control terminals of each of the semiconductor modules works as a low-potential terminal coupled electrically to low-potential electrodes of the capacitor devices, the voltage measuring terminals being coupled electrically to high-potential electrodes of the capacitor devices, and wherein the voltage detector is disposed adjacent to the low-potential terminals and uses the low-potential terminals and the voltage measuring terminals to measure the voltage developed at the capacitor.

14. A power converter as set forth in claim 8, wherein the casing has an outer wall on which terminal holders are formed, each of the terminal holders being made up of a pair of protrusions which hold a portion of one of the voltage measuring terminals in contact therewith, a contact of one of the pair of protrusions with the one of the voltage measuring terminals being located closer to the opening of the casing than the other of the pair of protrusions.

15. A power converter as set forth in claim 14, wherein a given number of the terminal holders are provided to hold each of the voltage measuring terminals, the given number of the terminal holders being broken down into two types: a projection terminal holder and a flat face terminal holder, the protrusions of the projection terminal holder having projections which form a grip through which one of the voltage measuring terminals passes, the protrusions of the flat face terminal holder having flat faces which are placed in surface contact with the one of the voltage measuring terminals, the flat face terminal holder being located closer to the control circuit board than the projection terminal holder.

16. A power converter as set forth in claim 14, wherein each of the voltage measuring terminals has reinforcement ribs which are placed in contact with a corresponding one of the terminal holders and extend substantially parallel to an outer wall of the casing.

* * * * *